United States Patent
Kubo et al.

(10) Patent No.: US 8,139,398 B2
(45) Date of Patent: Mar. 20, 2012

(54) DATA READ/WRITE DEVICE

(75) Inventors: Koichi Kubo, Yokohama (JP); Takahiro Hirai, Yokohama (JP); Shinya Aoki, Yokohama (JP); Robin Carter, Yokohama (JP); Chikayoshi Kamata, Atsugi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/052,803

(22) Filed: Mar. 21, 2011

(65) Prior Publication Data

US 2011/0170333 A1 Jul. 14, 2011

Related U.S. Application Data

(63) Continuation of application No. 12/762,871, filed on Apr. 19, 2010, now Pat. No. 7,936,587, which is a continuation of application No. 11/535,784, filed on Sep. 27, 2006, now Pat. No. 7,733,684.

(30) Foreign Application Priority Data

Dec. 13, 2005 (JP) .................... 2005-359301
Aug. 31, 2006 (JP) .................... 2006-236743

(51) Int. Cl.
*G11C 11/00* (2006.01)

(52) U.S. Cl. ........ 365/148; 365/151; 365/164; 365/174; 365/175

(58) Field of Classification Search .......... 365/148, 365/164, 174, 175, 151
See application file for complete search history.

(56) References Cited

U.S. PATENT DOCUMENTS

| | | | |
|---|---|---|---|
| 3,613,100 A | 10/1971 | Kaufer et al. | |
| 5,051,291 A | 9/1991 | Kawahara et al. | |
| 5,297,132 A | 3/1994 | Takano et al. | |
| 6,468,730 B2 | 10/2002 | Fujiwara et al. | |
| 6,756,177 B2* | 6/2004 | Matsumoto et al. | 430/138 |
| 6,815,744 B1 | 11/2004 | Beck et al. | |
| 7,081,289 B2* | 7/2006 | Ohno et al. | 428/64.1 |
| 7,105,217 B2* | 9/2006 | Ohno et al. | 428/64.1 |
| 7,355,884 B2 | 4/2008 | Nakayama et al. | |
| 7,394,680 B2* | 7/2008 | Toda et al. | 365/148 |
| 7,400,522 B2 | 7/2008 | Toda et al. | |

(Continued)

FOREIGN PATENT DOCUMENTS

CN 1624803 A 6/2005

(Continued)

OTHER PUBLICATIONS

Tamihiro Gotoh, et al., "Minimal Phase-Change Marks Produced in Amorphous Ge2Sb2Tes Films", Japanese Journal of Applied Physics, vol. 43, No. 68, 2004, pp. L818-L821.

(Continued)

*Primary Examiner* — Viet Q Nguyen

(74) *Attorney, Agent, or Firm* — Oblon, Spivak, McClelland, Maier & Neustadt, L.L.P.

(57) ABSTRACT

A data read/write device according to an example of the present invention includes a recording layer, and means for applying a voltage to the recording layer, generating a resistance change in the recording layer, and recording data. The recording layer is composed of a composite compound having at least two types of cation elements, at least one type of the cation element is a transition element having a "d" orbit in which electrons have been incompletely filled, and the shortest distance between the adjacent cation elements is 0.32 nm or less.

20 Claims, 18 Drawing Sheets

U.S. PATENT DOCUMENTS

| | | | |
|---|---|---|---|
| 7,459,715 B2 * | 12/2008 | Toda et al. | 257/2 |
| 7,623,370 B2 * | 11/2009 | Toda et al. | 365/163 |
| 7,733,684 B2 * | 6/2010 | Kubo et al. | 365/148 |
| 7,767,993 B2 * | 8/2010 | Toda et al. | 257/2 |
| 7,778,062 B2 | 8/2010 | Toda et al. | |
| 7,989,794 B2 * | 8/2011 | Toda et al. | 257/2 |
| 2006/0120205 A1 | 6/2006 | Odagawa et al. | |
| 2007/0133358 A1 | 6/2007 | Kubo et al. | |
| 2007/0298351 A1 * | 12/2007 | Shimada et al. | 430/281.1 |
| 2010/0008209 A1 | 1/2010 | Tsukamoto et al. | |

FOREIGN PATENT DOCUMENTS

| | | |
|---|---|---|
| EP | 000574025 A2 | 6/1993 |
| EP | 000919997 A1 | 6/1999 |
| JP | 2004-185756 | 7/2004 |
| JP | 2004-234707 | 8/2004 |
| JP | 2005-252068 | 9/2005 |
| JP | 2005-317787 | 11/2005 |
| JP | 2006-80259 | 3/2006 |
| WO | WO 2005/101420 A1 | 10/2005 |

OTHER PUBLICATIONS

A. Sawa, et al., "Hysteretic current-voltage characteristics and resistance switching at a rectifying Ti/Pro.7Cao.3MnO3 interface", Applied Physics Letters, vol. 85, No. 18, Nov. 1, 2004, pp. 4073-4075.

P. Vettiger, et al., "The "Millipede"-Nanotechnology Entering Data Storage", IEEE Transactions on Nanotechnology, vol. 1, No. 1, Mar. 2002, pp. 39-55.

P. Veltiger, et al., "Thousands of Microcanlilevers for Highly Parallel and Ultra-dense Data Storage", IEEE, Technical Digest, IEDM 03, 2003, pp. 763-766.

Atsushi Onoe, et al., "Nano-sized domain inversion characteristics in LiNb03 group single crystals using SNDM", Materials Science and Engineering B Additional References sheet(s) attached 120,2005, pp. 130-133.

Notice of Reasons for Rejection mailed Nov. 24, 2010, in Japanese Patent Application No. 2006-336115 (with English translation).

Office Action mailed on Sep. 8, 2010, in China Patent Application No. 200610168972.7 (with English-language Translation).

* cited by examiner

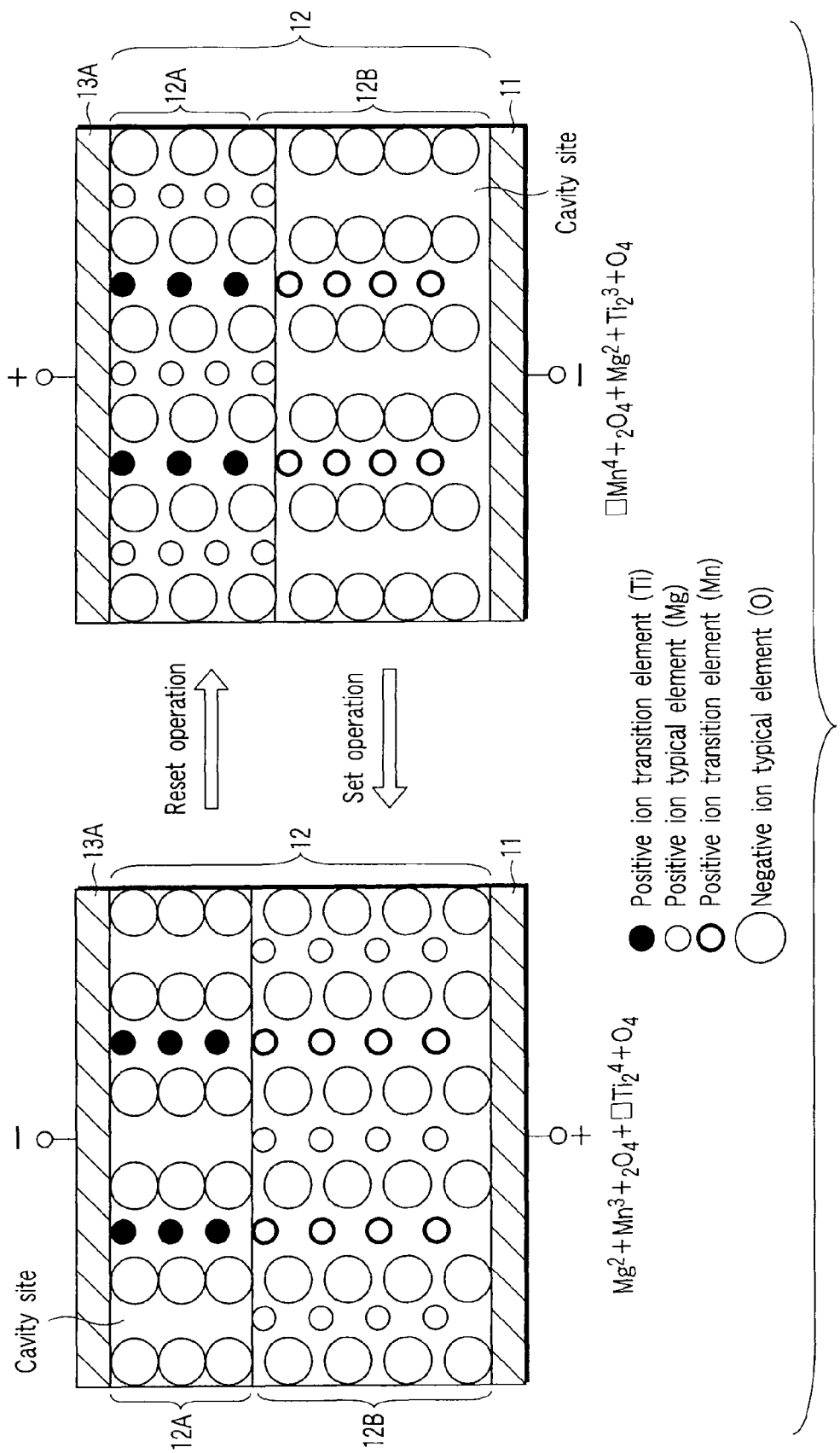
F I G. 2

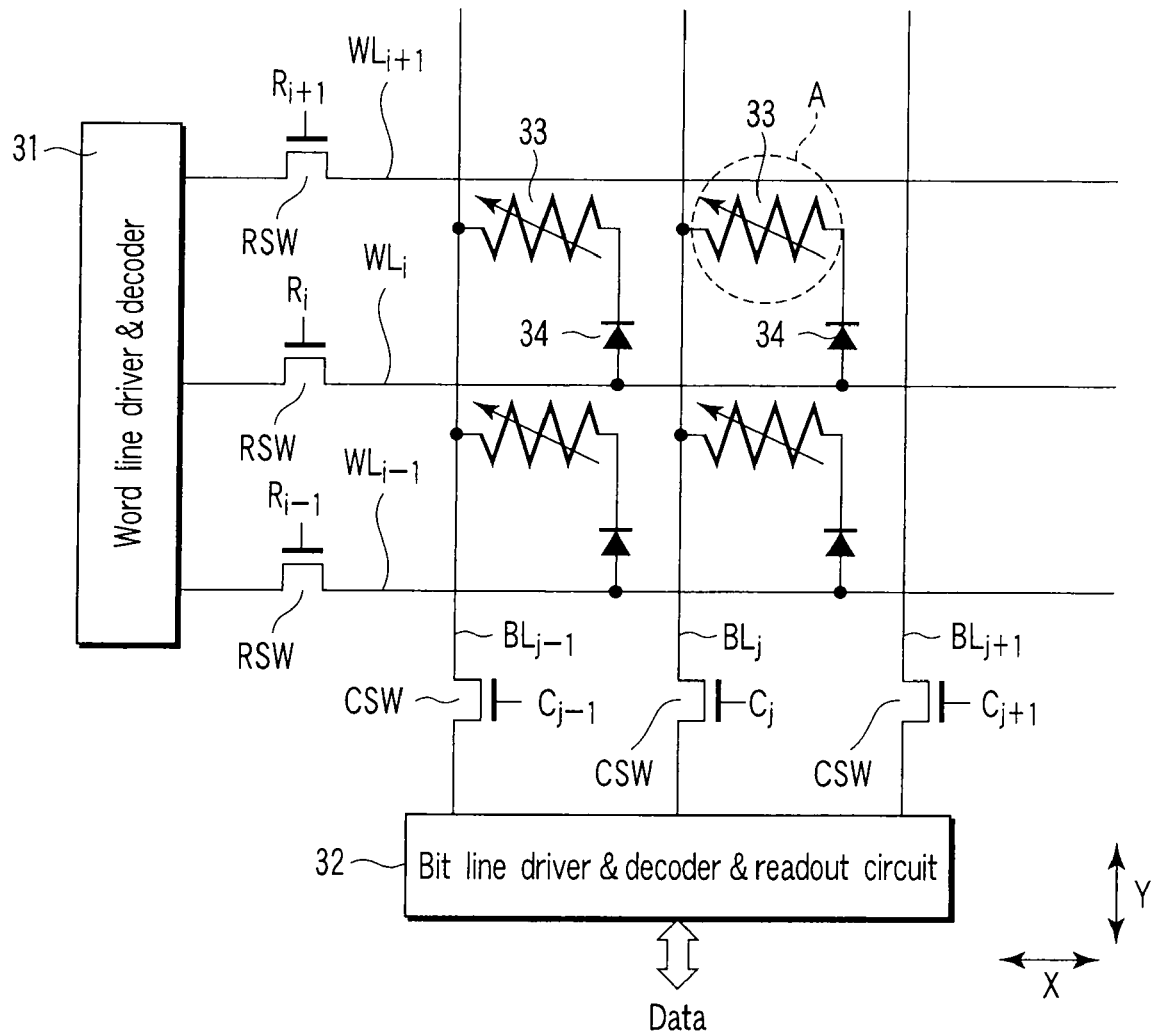
F I G. 11

DATA READ/WRITE DEVICE

CROSS-REFERENCE TO RELATED APPLICATIONS

This application is a continuation application of prior U.S. patent application Ser. No. 12/762,871 which is a continuation application of prior U.S. patent application Ser. No. 11/535,784, the disclosure of which is incorporated by reference in its entirety. U.S. Ser. No. 12/762,871 and U.S. Ser. No. 11/535,784 claim the benefit of priority from Japanese Patent Applications No. 2005-359301, filed Dec. 13, 2005; and No. 2006-236743, filed Aug. 31, 2006, the entire contents of both of which are incorporated herein by reference.

BACKGROUND OF THE INVENTION

1. Field of the Invention

The present invention relates to a data read/write device having high recording density.

2. Description of the Related Art

In recent years, a small sized portable device has been prevalent worldwide. At the same time, with significant progress of a high-speed data transmission network, a demand for a small sized large capacity nonvolatile memory has rapidly increased. Among them, a NAND-type flash memory and a small sized hard disk drive (HDD) have made rapid progress in recording density, and a large market has been formed.

However, in both of them, a limit of recording density has already been pointed out. That is, there is a problem that an increase of processing cost caused by reduction of a minimum line width becomes remarkable in the NAND-type flash memory and tracking precision cannot be sufficiently allocated in a small sized HDD.

There have been proposed some ideas of novel memories aiming to significantly exceed the limit of recording density, under such a situation.

For example, a phase change memory (PRAM) uses a recording material capable of taking two states, i.e., an amorphous state (ON) and a crystalline state (OFF). A principle of recording data is that the two states are associated with binary data "0" and "1", respectively.

With respect to a write/erasure operation, for example, the amorphous state is produced by applying a large electric power pulse to a recording material while the crystalline state is produced by applying a small electric power pulse to a recording material.

A read operation is made by supplying a small amount of a read current to a recording material to such an extent that write/erasure does not occur, and then, measuring an electrical resistance of the recording material. A resistance value of the recording material in the amorphous state is greater than that of the recording material in the crystalline state, and a difference therebetween is in order of $10^3$.

The maximum feature of the PRAM is that operation can be made even if an element size is reduced to an order of 10 nm. In this case, the recording density of about 1.5 Tbpsi (terra bite per square inch) can be achieved, thus providing one of the candidates for the achievement of high density recording (refer to, for example, JP-A 2005-252068(KOKAI)).

Although different from the PRAM, there has been reported a novel memory having a principle of operation that is very similar to the PRAM (refer to, for example, JP-A 2004-234707(KOKAI)).

According to this report, a typical example of the recording material for recording data is nickel oxide. Like the PRAM, a large electric power pulse and a small electric power pulse are used for a write/erasure operation. In this case, there has been reported an advantage that power consumption at the time of the write/erasure operation is reduced as compared with the PRAM.

Although, up to now, an operational mechanism of this novel memory has not been clarified, its reproducibility is verified, thus providing another one of the candidates for the achievement of high density recording. In addition, with respect to the operational mechanism as well, some groups have attempted to clarify the mechanism.

In addition to these memories, an MEMS memory using a MEMS (micro electro mechanical systems) technique has been proposed (refer to, for example, P. Vettiger, G. Cross, M. Despont, U. Drechsler, U. Durig, B. Gotsmann, W. Haberle, M. A. Lants, H. E. Rothuizen, R. Stutz and G. K. Binning, IEEE Trans. Nanotechnology 1, 39 (2002)).

In particular, a MEMS memory called Millipede has a structure in which a plurality of array-shaped cantilevers and recording media having an organic substance applied thereto are opposed to each other. A probe of a distal end of the cantilever comes into contact with the recording medium at a proper pressure.

The write operation is selectively made by controlling a temperature of a heater which is added to the probe. That is, if the heater temperature is increased, the recording medium is softened, the probe sinks into the recording medium, and then, a cavity is formed in the recording medium.

The read operation is made in such a manner that, while a current to such an extent that the recording medium is not softened is supplied to a probe, the probe is made to scan on the surface of the recording medium. If the probe falls into the cavity of the recording medium, the probe temperature decreases, and then, the resistance value of the heater increases. Thus, data can be sensed by reading a change of the resistance value.

The maximum feature of the MEMS memory such as Millipede is that the recording density can be remarkably improved because it is necessary to provide wiring at each recording portion for recording bit data. As it now stands, the recording density of about 1 Tbpsi has already been achieved (refer to, for example, P. Vettiger, T. Albrecht, M. Despont, U. Drechsler, U. Durig, B. Gotsmann, D. Jubin, W. Haberle, M. A. Lants, H. E. Rothuizen, R. Stutz, D. Wiesmann and G. K. Binnig, P. Bechtold, G. Cherubini, C. Hagleitneri, T. Loeliger, A. Panmtazi, H. Pozidis and E. Eleftheriou, in Technical Digest, IEDM03 pp. 763-766).

Upon the receipt of Millipede, recently there has been made an attempt to achieve remarkable improvement with respect to power consumption, recording density, an operating speed and the like by combining a MEMS technique and a new principle of recording.

For example, there has been proposed a system of providing a ferroelectric layer at a recording medium, and then, applying a voltage to the recording medium, thereby inducing dielectric polarization in the ferroelectric layer to record data. According to this system, there is a theoretical prediction that a gap (recording minimum unit) between recording portions for recording bit data can be approached to a unit bulla level of a crystal.

Assuming that a minimum unit of recording becomes 1 unit bulla of the crystal of the ferroelectric layer, the recording density is obtained as a very large value of about 4 Pbsi (pico bite per square inch).

However, even up to now, such a MEMS memory capable of ferroelectric recording has not been achieved, although it is a conventionally known principle.

The largest reason is that an electric field coming out of the recording medium to the outside thereof is interrupted by ions in air. Namely, the electric field from the recording medium cannot be sensed, thus disabling a read operation.

There is another reason that, when a lattice defect exists in a crystal, an electric charge caused by such a lattice defect moves to a recording portion, interrupting the electric charge.

The former problem with electric field interruption caused by the ions in the air is solved by proposing a read system using a scanning type nonlinear dielectric microscope (SNDM), and this novel memory is remarkably progressed for the achievement of practical use (refer to, for example, A. Onoue, S. Hashimoto, Y. Chu, Mat. Sol. Eng. B 120, 130 (2005)).

BRIEF SUMMARY OF THE INVENTION

A data read/write device according to one aspect of the present invention comprises a recording layer, and means for applying a voltage to the recording layer, generating a resistance change in the recording layer, and recording data, wherein the recording layer is composed of a composite compound having at least two types of cation elements, at least one type of the cation element is a transition element having a "d" orbit in which electrons have been incompletely filled, and the shortest distance between the adjacent cation elements is 0.32 nm or less.

A data read/write device according to another aspect of the present invention comprises a recording layer, and means for applying a voltage to the recording layer, generating a resistance change in the recording layer, and recording data, wherein the recording layer is composed of: i. a first compound represented by AxMyXz (where A and M are cation elements, X is at least one element selected from O, S, Se, N, Cl, Br, and I, and molar ratios x, y and z satisfy $0.5 \leq x \leq 1.5$, $0.5 \leq y \leq 2.5$, and $1.5 \leq z \leq 4.5$, respectively); and ii. a second compound having at least one transition element and having a cavity site capable of housing the cation element of the first compound.

BRIEF DESCRIPTION OF THE SEVERAL VIEWS OF THE DRAWING

FIG. 2 is a diagram showing a principle of recording;
FIG. 11 is a diagram showing a semiconductor memory according to an example of the present invention.

DETAILED DESCRIPTION OF THE INVENTION

Figure 1:
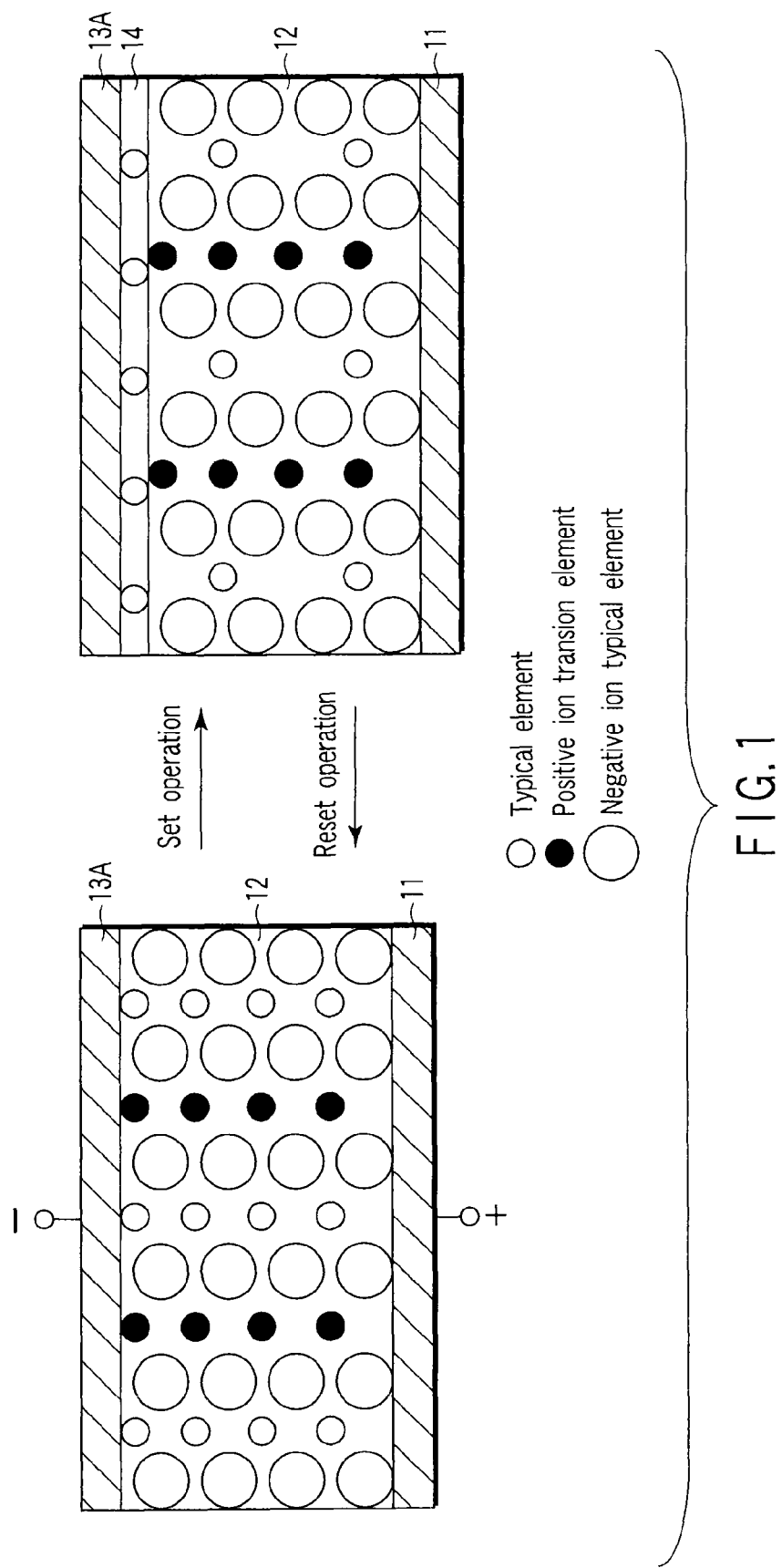
FIG. 1 is a diagram showing a principle of recording.

A data read/write device of an aspect of the present invention will be described below in detail with reference to the accompanying drawings.

1. Outline (1) In a data read/write device according to a first example of the present invention, a recording layer is composed of a composite compound having at least two types of cation elements. At least one type of cation element is defined as a transition element having a "d" orbit in which electrons have been incompletely satisfied and the shortest distance between the adjacent cation elements is defined to be 0.32 nm or less.

The transition element having the "d" orbit in which electrons have been incompletely satisfied is, for instance, Ti having univalent, bivalent or trivalent, Mn having one of univalent to sexivalent, Co having one of univalent to octavalent, Ni having one of univalent to nonavalent.

The reason why the shortest distance between the adjacent cation elements is defined to be 0.32 nm or less is that a degree of electron transmission in the recording layer is improved.

Specifically, the recording layer is composed of the following materials.

$A_xM_yX_4$ 

In the formula, A is at least one element selected from the group consisting of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi.

Preferably, A is at least one element selected from the group consisting of Mg, Al, Mn, Fe, Co, Ni, and Zn. This is because using these elements optimizes ion radium for maintaining a crystalline structure and a degree of ion transfer can be sufficiently allocated.

In the formula, M is at least one element selected from the group consisting of Al, Ga, Ti, Ge, Sn, V, Cr, Mn, Fe, Co, Ni, Nb, Ta, Mo, W, Ru, and Rh.

Preferably, M is at least one element selected from the group consisting of V, Cr, Mn, Fe, Co, and Ni. This is because using these elements makes it easy to control an electron state in crystal.

A and M are elements that are different from each other, and X is at least one element selected from the group consisting of O and N. Molar ratios x and y are assumed to satisfy $0.1 \leq x \leq 2.2$, and $1.8 \leq y \leq 2$, respectively.

$A_xM_yX_3$ 

In the formula, A is at least one element selected from the group consisting of Na, K, Rb, Be, Mg, Ca, Sr, Ba, Al, Ga, Mn, Fe, Co, Ni, Cu, Zn, Ge, Ag, Au, Cd, Sn, Sb, Pt, Pd, Hg, Tl, Pb, and Bi.

Preferably, A is at least one element selected from the group consisting of Mg, Al, Mn, Fe, Co, Ni, and Zn. This is because using these elements optimizes ion radium for maintaining a crystalline structure and a degree of ion transfer can be sufficiently allocated.

In the formula, M is at least one element selected from the group consisting of Al, Ga, Ti, Ge, Sn, V, Cr, Mn, Fe, Co, Ni, Nb, Ta, Mo, W, Ru, and Rh.

Preferably, M is at least one element selected from the group consisting of V, Cr, Mn, Fe, Co, and Ni. This is because using these elements makes it easy to control an electron state in crystal.

A and M are elements that are different from each other, and X is at least one element selected from the group consisting of O and N. Molar ratios x and y are assumed to satisfy $0.5 \leq x \leq 1.1$, and $0.9 \leq y \leq 1$, respectively.

$A_xM_yX_4$

In the formula, A is at least one element selected from the group consisting of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi.

Preferably, A is at least one element selected from the group consisting of Mg, Al, Ga, Sb, Ti, Mn, Fe, and Co. This is because using these elements optimizes ion radium for maintaining a crystalline structure and a degree of ion transfer can be sufficiently allocated.

In the formula, M is at least one element selected from the group consisting of Al, Ga, Ti, Ge, Sn, V, Nb, Ta, Cr, Mn, Mo, W, Ir, and Os.

Preferably, M is at least one element selected from the group consisting of Cr, Mn, Mo, and W. This is because using these elements makes it easy to control an electron state in crystal.

A and M are elements that are different from each other, and X is at least one element selected from the group consisting of O and N. Molar ratios x and y are assumed to satisfy $0.5 \leq x \leq 2.2$, and $0.9 \leq y \leq 1$, respectively.

With respect to the molar ratios x, y of the above-described three materials ($A_xM_yX_4$, $A_zM_yX_3$, $A_xM_yX_4$), the lower limit of the numeric range is set in order to maintain a crystalline structure, and the upper limit is set in order to control an electron state in crystal.

In addition, the recording layer employs one of the following crystalline structures:
Spinel structure
Cryptomelen structure
Ilmenite structure
Marokite structure
Hollandite structure
Heterolite structure
Ramsdelite structure
Delafossite structure
Olivine structure
α-NaFeO$_2$ structure
LiMoN$_2$ structure By using the recording layer as described above, the recording density of Pbpsi class can be principally achieved, and further, low power consumption can be also achieved.

(2) In the data read/write device according to a second example of the present invention, a recording layer is composed of i. a first compound represented by AxMyXz (where A and M are cation elements; X is at least one element selected from O, S, Se, N, Cl, Br, and I; and $0.5 \leq x \leq 1.5$, $0.5 \leq y \leq 2.5$, and $1.5 \leq z \leq 4.5$ are established); and ii. a second compound having at least one transition element and having a cavity site capable of housing a cation element of the first compound.

The second compound is composed of one of:
i. □xMZ$_2$
where □ is the cation element housed in the cavity site; M is at least one element selected from Ti, Ge, Sn, V, Cr, Mn, Fe, Co, Ni, Nb, Ta, Me, W, Re, Ru, and Rh; X is at least one element selected from O, S, Se, N, Cl, Br, and I; and $0.3 \leq x \leq 1$ is established;
ii. □xMX$_3$
where □ is the cation element housed in the cavity site; M is at least one element selected from Ti, Ge, Sn, V, Cr, Mn, Fe, Co, Ni, Nb, Ta, Mo, W, Re, Ru, and Rh; X is at least one element selected from O, S, Se, N, Cl, Br, and I; and $1 \leq x \leq 2$ is established;
iii. □xMX$_4$
where □ is the cation element housed in the cavity site; M is at least one element selected from Ti, Ge, Sn, V, Cr, Mn, Fe, Co, Ni, Nb, Ta, Mo, W, Re, Ru, and Rh; X is at least one element selected from O, S, Se, N, Cl, Br, and I; and $1 \leq x \leq 2$ is established; and
iv. □xMPOz
where □ is the cation element housed in the cavity site; M is at least one element selected from Ti, Ge, Sn, V, Cr, Mn, Fe, Co, Ni, Nb, Ta, Mo, W, Re, Ru, and Rh; P is a phosphorous element; O is an oxygen element; and $0.3 \leq x \leq 3$, and $4 \leq z \leq 6$ are established.

In addition, the second compound employs one of the following crystalline structures:
Hollandite structure
Ramsdelite structure
Anatase structure
Brookite structure
Pyrolusite structure
ReO$_3$ structure
MoO$_{1.5}$PO$_4$ structure
TiO$_{0.5}$PO$_4$ structure
FePO$_4$ structure
βMnO$_2$
γMnO$_2$
λMnO$_2$ A Fermi level of electrons of the first compound is lower than that of electrons of the second compound. This is one of the conditions required to cause a state of the recording layer to provide irreversible property. Any of the Fermi levels used here is obtained as a value measured from a vacuum level.

By using the recording layer as described above, the recording density of Pbpsi class can be principally achieved, and further, low power consumption can be also achieved.

2. Basic Principles of Recording, Erasing, and Reproducing Operations (1) A description will be given with respect to basic principles of data recording, erasing, and reproducing operations in the data read/write device according to the first example of the present invention.

FIG. 1 shows a structure of a recording portion.

Reference numeral 11 denotes an electrode layer; 12 denote a recording layer; and 13A denotes an electrode layer (or protective layer).

A small white circle in the recording layer 12 denotes a positive ion, and a small black circle denotes a negative ion. A large white circle denotes a transition element.

Some of the positive ion moves in crystal, when a voltage is applied to the recording layer 12 to generate a potential gradient in the recording layer 12. Therefore, in an example of the present invention, an initial state of the recording layer 12 is defined as an insulator (high resistance state). A recording operation is achieved by phase-changing the recording layer 12 in accordance with the potential gradient, and causing the recording layer 12 to provide electrical conductivity (to establish a low resistance state).

First, for example, a state in which a potential of the electrode layer 13A is relatively lower than that of the electrode layer 11 is produced. A negative potential may be applied to the electron layer 13A, if the electron layer 11 is a fixed potential (for example, grounding potential).

At this time, some of the positive ion contained in the recording layer 12 move to the side of the electrode layer (cathode) 13A, and the positive ion in the recording layer (crystal) 12 relatively decrease with respect to negative ions. The positive ions that move to the electrode layer 13A receive electrons from the electrode layer 13A, and are precipitated as a metal to form a metal layer 14.

The negative ions become excessive at the inside of the recording layer 12, and as a result, the valence number of the transition elements contained in the recording layer 12 is increased. Namely, the recording layer 12 has electron conductivity due to carrier implantation, and thus, the recording (set operation) completes.

A reproducing operation can be easily achieved in such a manner that a current pulse is supplied to the recording layer 12 to detect a resistance value of the recording layer 12. However, it is necessary that the current pulse is a small value to such an extent that a material configuring the recording layer 12 does not cause a resistance change.

The above process is one kind of electrophoresis, and it is possible to consider that an oxidizing agent is generated due to electrochemical oxidization at the side of the electrode layer (anode) 11 while a reducing agent is generated by electrochemical reduction at the side of the electrode layer (cathode) 13A.

Thus, in order to return a recording state (low resistance state) to an initial state (high resistance state), it suffices that, for example, the recording layer 12 is Joule-heated by a mass current pulse to promote an oxidization reduction reaction of the recording layer 12. That is, the recording layer 12 returns to an insulator due to the residual heat after interruption of the mass current pulse (reset operation).

However, in order to practically use this principle of operation, it must be verified that no reset operation occurs at room temperature (a sufficiently long retention time interval is allocated) and that power consumption of the reset operation is sufficiently small.

The former operation can be achieved by setting the valence number of positive ion equal to or greater than dihydric.

The latter operation can be achieved by finding out an ion radius and a transfer path of positive ion that move in the recording layer (crystal) 12. As such a recording layer 12, the elements and crystalline structures described previously may be employed.

In the meantime, the oxidizing agent is generated at the side of the electrode layer (anode) 11 after the reset operation. For this reason, it is preferable that the electrode layer 11 is composed of a hardly oxidized material (such as electrically conductive nitride or electrically conductive oxide, for example).

In addition, it is preferable that such a material have no ion conductivity.

Examples of such a material include the following materials. Among them, $LaNiO_3$ is the most preferable material in view of comprehensive performance considering good electrical conductivity or the like.

MN

In the formula, M is at least one element selected from the group consisting of Ti, Zr, Hf, V, Nb, and Ta; and N is nitrogen.

$MO_x$

In the formula, M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt; and a molar ratio "x" is assumed to satisfy $1 \leqq x \leqq 4$.

$AMO_3$

In the formula, A is at least one element selected from the group consisting of La, K, Ca, Sr, Ba, and Ln (Lanthanide);

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt; and O is oxygen.

$A_2MO_4$

In the formula, A is at least one element selected from the group consisting of K, Ca, Sr, Ba, and Ln (Lanthanide);

M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt; and O is oxygen.

The reducing agent is produced at the side of the protective layer (cathode) 13 after the set operation has been made. For this reason, it is preferable that the protective layer 13 has a function of preventing the recording layer 12 from reacting with atmospheric air.

Examples of such a material include a semiconductor made of amorphous carbon, diamond-like carbon, $SnO_2$ and the like.

The electrode layer 13A may be caused to function as a protective layer for protecting the recording layer 12, or a protective layer may be provided instead of the electrode layer 13A. In this case, the protective layer may be an insulator or an electric conductor.

In order to efficiently carry out heating of the recording layer 12 in the reset operation, it is preferable to provide a heater layer (material having resistance rate of about $10^{-5}$ Ωcm or more) at the side of the electrode layer 13A.

(2) A description will be given with respect to basic principles of recording, erasing, and reproducing information in an information recording/reproducing apparatus according to a second example of the present invention.

FIG. 2 shows a structure of a recording unit.

Reference numeral 11 denotes an electrode layer; reference numeral 12 denotes a recording layer; and reference numeral 13A denotes an electrode layer (or protecting layer).

The recording layers 12 are allocated at the side of the electrode layer 13A, and composed of a first compound 12A allocated at the side of the electrode layer 13A and expressed by $A_xM_yX_z$ and a second compound 12B allocated at the side of the electrode layer 11, having at least one type of transition element, and having a cavity site capable of housing an positive ion element of the first compound.

Specifically, in an initial state (reset state), the first compound 12A is expressed by $A_xM_yZ_x$. The second compound 12B has at least one type of transition element and has a cavity site capable of housing the positive ion element of the first compound.

In a set state, the second compound 12B has at least one type of transition element and is established in a state in which the positive ion element of the first compound is housed in a cavity site that has essentially existed. At this time, the first compound 12A is established in a state in which the compound is expressed by Ax-uMyXz (an element A has decreased by "u" produced when the element has moved to the second compound 12B).

Here, for the purpose of simplification of the following description, the initial state (reset state) denotes a state in which a resistance value of the recording layer 12 is high, and the set state denotes a state in which the resistance value of the recording layer 12 is low.

In the case where the second compound 12B is $Mg^{2+}Ti_2^{3+}I_4$ (or $\Box Ti_2^{4+}O_4$) and the first compound 12A is $\Box Mn_2^{4+}O_4$ (or $Mg^{2-}Mn_2^{3+}O_4$), a resistance value of the initial state (reset state) is high, and a resistance value of the set state is low.

This definition does not imply that an example of the present embodiment is limited thereto.

Even if a device structure is identical to another, the resistance value of the recording layer 12 changes according to types of the first and second compounds 12A and 12B so that the resistance values of the set and reset states can be freely set according to a product to which an example of the present invention is applied.

Three types of small circles in the recording layer 12 each designate a positive ion element, and a large circle denotes a negative ion element.

Figure 3:
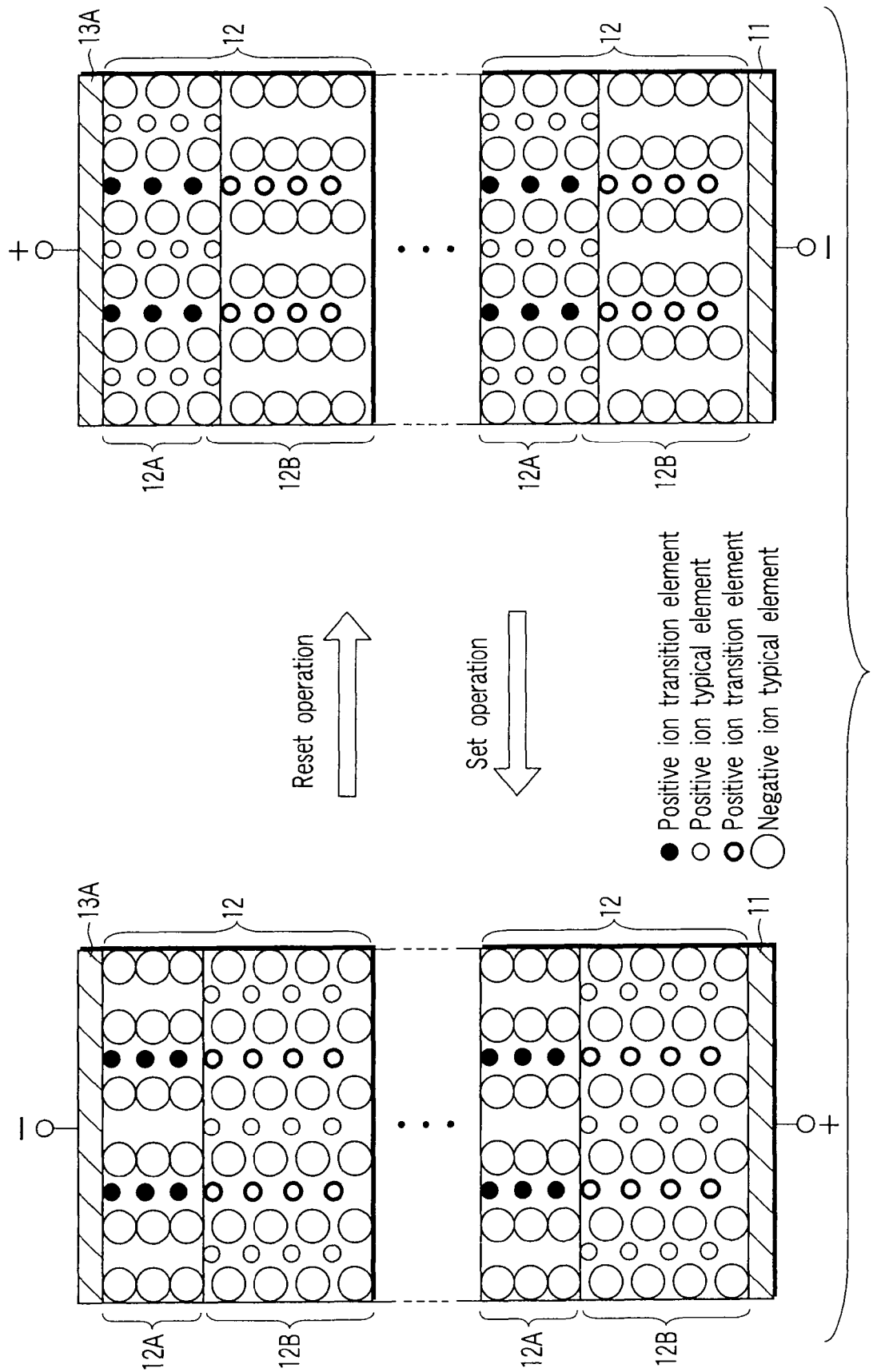
FIG. 3 is a diagram showing a principle of recording.

As shown in FIG. 3, the first and second compounds 12A and 12B configuring the recording layer 12 each may be stacked on two or more multiple layers.

When an electronic potential on which the electrode layer 13A is an anode and the electrode layer 11 is a cathode is applied to such a recording unit, and an electric potential gradient is generated in the recording layer 12, part of the positive ion element in the first compound 12A moves in a crystal, and then, advances into the second compound 12B of the cathode side.

Because a cavity site capable of housing a positive ion element is present in the crystal of the second compound 12B, the positive ion element having moved from the first compound 12A is housed in this cavity site.

Thus, the valence of the positive ion (transition element) in the first compound 12A increases, and then, the valence of the positive ion (transition element) in the second compound 12B decreases.

Therefore, in the initial state (reset state), assuming that the recording layers 12A and 12B each are established in a high resistance state (each of which becomes an insulation state), part of the positive ion element in the first compound 12A moves into the second compound 12B, whereby the recording layer 12 changes the current state to a low resistance state (each of which becomes an electrically conductive element), and a set state is established.

In addition, when an electric potential on which the electrode layer 11 is an anode and the electrode layer 13A is a cathode is applied, and an electric potential gradient is generated in the recording layer 12, part of the positive ion element in the second compound 12B moves into a crystal, and then, advances into the first compound 12A of the cathode side.

Because a cavity site capable of housing a positive ion element is present in the crystal of the first compound 12A, the positive ion element having moved from the second compound 12B is housed in this cavity site.

Thus, the valence of the positive ion (transition element) in the second compound 12B increases, and then, the valence of the positive ion (transition element) in the first compound 12A decreases.

Therefore, part of the positive ion element in the second compound 12B moves into the first compound 12A, whereby the recording layer 12 changes from the low resistance state (electrically conductive element) to the high resistance state (insulation element), and then, an initial state (reset state) is restored.

As described above, the set/reset operation can be controlled by an orientation of a voltage applied to the recording layer 12 (orientation of a voltage/current pulse).

In addition, the set/reset operation can also be controlled by the following method.

The reset operation can be carried out by applying an electric potential on which the electrode layer 11 is a cathode and the electrode layer 13A is an anode. In this case, an electric potential gradient is generated in the recording layer 12, and then, a current flow. At this time, a value equal to or smaller than a voltage at which an ion starts moving is set, or a pulse voltage of a width equal to or smaller than a time interval at which an ion can move is applied, whereby a Joule heat is generated. At this time, part of the positive ion element in the second compound 12B moves in a crystal, and then, advances into the first compound 12A of the cathode side (because the cathode site is lower in electrochemical energy).

Because a cavity site capable of housing an positive ion element is present in the crystal of the first compound 12A, the positive ion element having moved from the second compound 12B is housed in this cavity site.

Thus, the valence of the positive ion (transition element) in the second compound 12B increases, and then, the valence of the positive ion (transition element) in the first compound 12A decreases.

Therefore, an electrically conductive carrier having existed in the crystal of each of the first and second compounds 12A and 12B is eliminated, and the recording layer 12 changes from the low resistance state (electrically conductive element) to the high resistance state (insulation element).

At this time, at the same time, although an electron moves from the second compound 12B to the first compound 12A, a Fermi level of the electron of the first compound 12A is lower than that of the electron of the second compound 12B. Thus, total energy of the recording layer 12 decreases, and the above described reset state naturally advances.

In addition, after the set operation has completed, a high energy state is established as described above. However, in a situation in which a Joule heat is not generated when the recording layer 12 according to an example of the present invention is used, the set state can be continuously maintained.

This is because a so called ion transfer resistance works.

The valence of the element A in the second compound 12B is responsible for this working. The fact that this element is divalent has a very important meaning.

If the element A is a univalent element such as Li ion, a sufficient ion transfer resistance cannot be obtained in a set state, and immediately, a positive ion element returns from the second compound 12B to the first compound 12A. In other words, a sufficiently long retention time cannot be obtained.

In addition, assuming that the element A is a trivalent or higher element, a voltage require for the set operation increases. Thus, in the worst case, crystal decay may occur.

Therefore, it is preferable to provide an information recording/reproducing apparatus in which the valence of the element A is divalent.

In the meantime, after the set operation is completed, an oxidizing agent is generated on the anode side. Thus, it is preferable to employ a hardly oxidized material (for example, electrically conductive oxide) as the electrode layer 11.

It is preferable that the electrically conductive oxide should not have ion conductivity. As an example of such oxide, the following materials can be exemplified. The most preferable material from the viewpoint of comprehensive performance considering a good electric conductivity is $LaNiO_3$.

i. MN

In the formula, M is one type of element selected from Ti, Zr, Hf, V, Nb, and Ta, and N is a nitrogen element.

ii. MOx

In the formula, M is at least one type of element selected from Ti, V, Cr, Mn, Fe, Co, Ni, Cu, Zr, Nb, Mo, Ru, Rh, Pd, Ag, Hf, Ta, W, Re, Ir, Os, and Pt, and O is an oxygen element, and $1 \leq x \leq 4$ is established.

iii. $AMO_3$

In the formula, A is at least one type of element selected from K, Ca, Sr, Ba, and Ln (Lanthanide); M is at least one type of element selected from Ti, V, Cr, Mn, Fe, Co, Ni, Cu, Zr, Nb, Mo, Ru, Rh, Pd, Ag, Hf, Ta, W, Re, Ir, Os, and Pt; and O is an oxygen element.

iv. $A_2MO_4$

In the formula, A is at least one type of element selected from K, Ca, Sr, Ba, and Ln (Lanthanide); M is at least one type of element selected from Ti, V, Cr, Mn, Fe, Co, Ni, Cu, Zr, Nb, Mo, Ru, Rh, Pd, Ag, Hf, Ta, W, Re, Ir, Os, and Pt; and O is an oxygen element.

A reset operation may be carried out by promoting a phenomenon that the recording layer 12 is heated, and the positive ion element housed in the cavity site of the second compound 12B described above reverts to the first compound 12A.

Specifically, the recording layer 12 can be easily changed from the low resistance state (electrically conductive element) to the high resistance state (insulation element) by utilizing a Joule heat and its residual heat, the Joule heat being generated by applying a mass current pulse to the recording layer 12.

As described above, a mass current pulse is applied to the recording layer 12, whereby an electric resistance value of the recording layer 12 increases. Thus, the reset operation is achieved.

Here, in order to achieve low power consumption, it is important to find out a substance of which an ion radius and a transfer path of an positive ion element capable of moving in a crystal without causing a crystal destruction is present at the time of set operation.

The materials and crystalline structure described in the Outline is effective to meet such a condition and to achieve low power consumption.

It is generally preferable to provide a heater layer (material having resistance rate of about $10^{-5}$ Ωcm or more) for further promoting the reset operation.

In a probe memory, a reductive material precipitates on the cathode side. Thus, it is preferable to provide a surface protecting layer in order to prevent reaction with an atmosphere.

The heater layer and the surface protecting layer can be composed of one material having both of their functions. For example, a semiconductor such as an amorphous carbon, a diamond-like carbon, and $SnO_2$ has both of the heater function and the surface protecting function.

A reproducing operation can be easily carried out by supplying a current pulse to the recording layer 12, and then, detecting the resistance value of the recording layer 12.

However, it is necessary that the current pulse is a very small value to an extent that a material configuring the recording layer 12 does not cause a resistance change.

In examples of FIGS. 2 and 3, while the first compound 12A is allocated at the side of the electrode layer 13A, and the second compound 12B is allocated at the side of the electrode layer 11, this allocation may be reversed. In this case, the voltages (positive/negative voltages) applied to the electrode layers 11 and 13A are also reversed at the time of the set/reset operation.

3. Embodiments

Now, some embodiments that seem to be best will be described.

A description will be given below with respect to two cases, i.e., a case in which an example of the present invention is applied to a probe memory and a case in which it is applied to a semiconductor memory.

(1) Probe Memory

A. Structure

Figure 4:
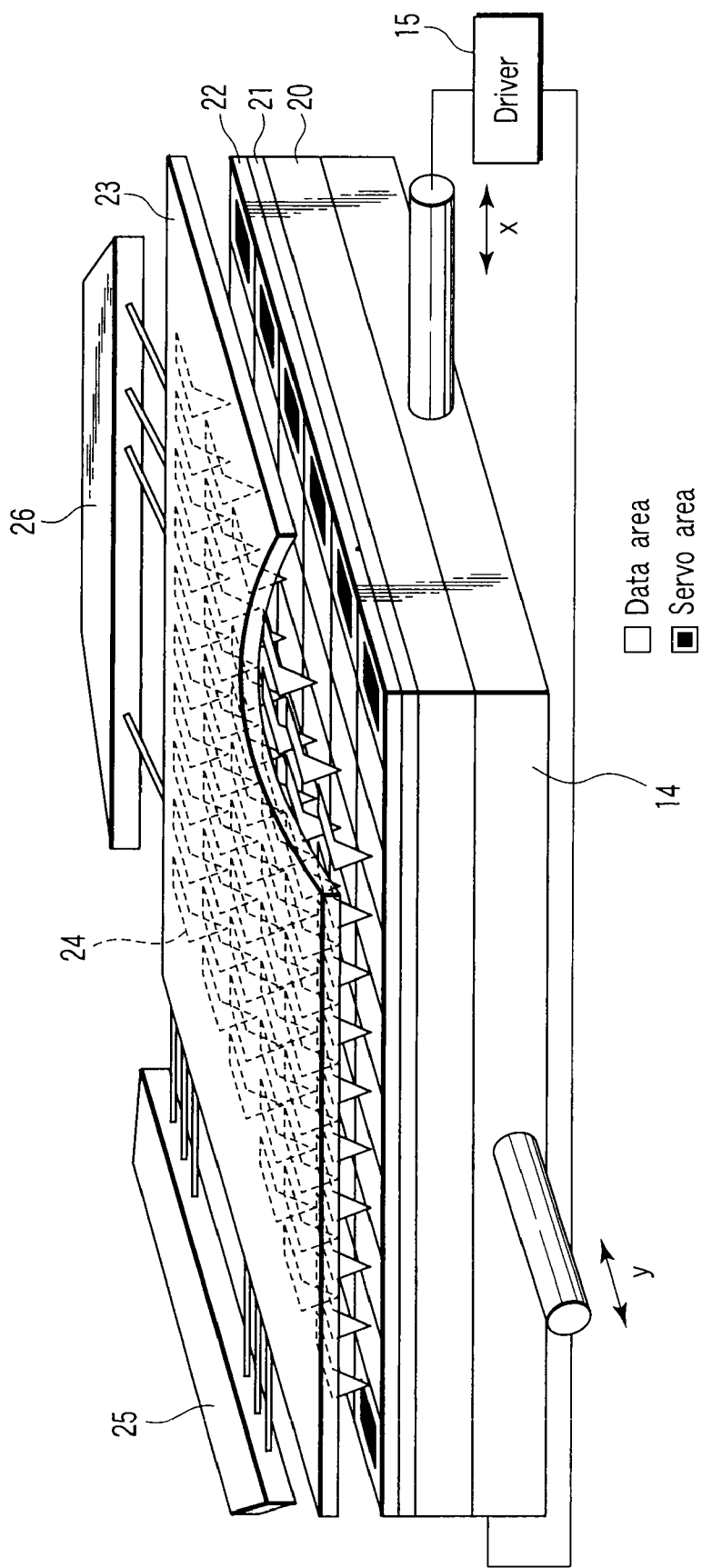
FIG. 4 is a view showing a probe memory according to an example of the present invention.
Figure 5:
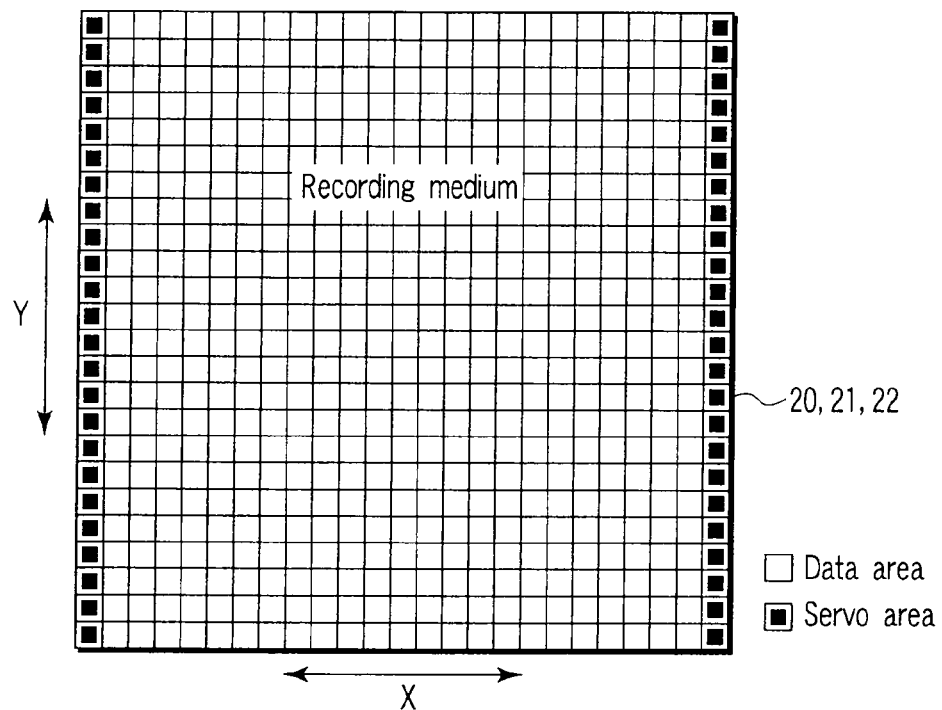
FIG. 5 is a diagram showing a recording medium.

FIGS. 4 and 5 each show a probe memory according to an example of the present invention.

A recording medium is arranged on an XY scanner 14. A probe array is arranged in the form opposed to the recording medium.

The probe array has a substrate 23 and a plurality of probes (heads) 24 arranged in an arrayed shape at one face side of the substrate 23. Each of the probes 24 is composed of, for example, a cantilever, and is driven by multiplex drivers 25 and 26.

The plurality of probes 24 each can be individually operated by using a micro actuator contained in the substrate 23. Here, a description will be given with respect to an example of making the same operation in all and providing an access to a data area of the recording medium.

First, all the probes 24 are reciprocated at a predetermined cycle in the X direction by using the multiplex drivers 25 and 26, and positional information in the Y direction is read from a servo area of the recording medium. The positional information in Y direction is transferred to a driver 15.

The driver 15 drives the XY scanner 14 on the basis of the positional information and moves the recording medium in Y direction, thereby positioning the recording medium and a probe.

After the positioning of them has completed, data read or write operation is carried out at the same time and continuously with respect all the probes 24 on the data area.

Data read and write operations are continuously made because the probe 24 is reciprocated in the X direction. The data read and write operations are also carried out with respect to the data area, on one by one line basis, by sequentially changing the position of the recording medium in the Y direction.

The recording medium is reciprocated at a predetermined cycle in the X direction, and positional information is read from the recording medium, whereby the probe 24 may be moved in the Y direction.

The recording medium is configured by, for example, a substrate 20, an electrode layer 21 placed on the substrate 20, and a recording layer 22 placed on the electrode 21.

The recording layer 22 has a plurality of data areas and servo areas arranged at both ends of the plurality of data areas in the X direction. The data areas occupy essential parts of the recording layer 22.

A servo burst signal is recorded in the servo area. The servo burst signal indicates the positional information in the X direction in the data area.

In the recording layer 22, in addition to these items of information, an address area in which address data is to be recorded and a preamble area for obtaining synchronization are further arranged.

The data and servo burst signal are recorded in the recording layer 22 as a recording bit (electrical resistance fluctuation). "1" and "0" information of the recording bits are read by detecting the electrical resistance of the recording layer 22.

In this example, one probe (head) is provided in association with one data area, and one probe is provided in response to one servo area.

The data area is composed of a plurality of tracks. A track in the data area is specified by an address signal read from the address area. In addition, the servo burst signal read from the servo area is intended to move the probe 24 to the center of the track and eliminate a read error of a recording bit.

Here, the X direction and Y direction are associated with a down track direction and a track direction, respectively, so that it is possible to utilize an HDD head position control technique.

B. Recording/Reproducing Operation

A recording/reproducing operation of the probe memory shown in FIGS. 4 and 5 will be described.

Figure 6:
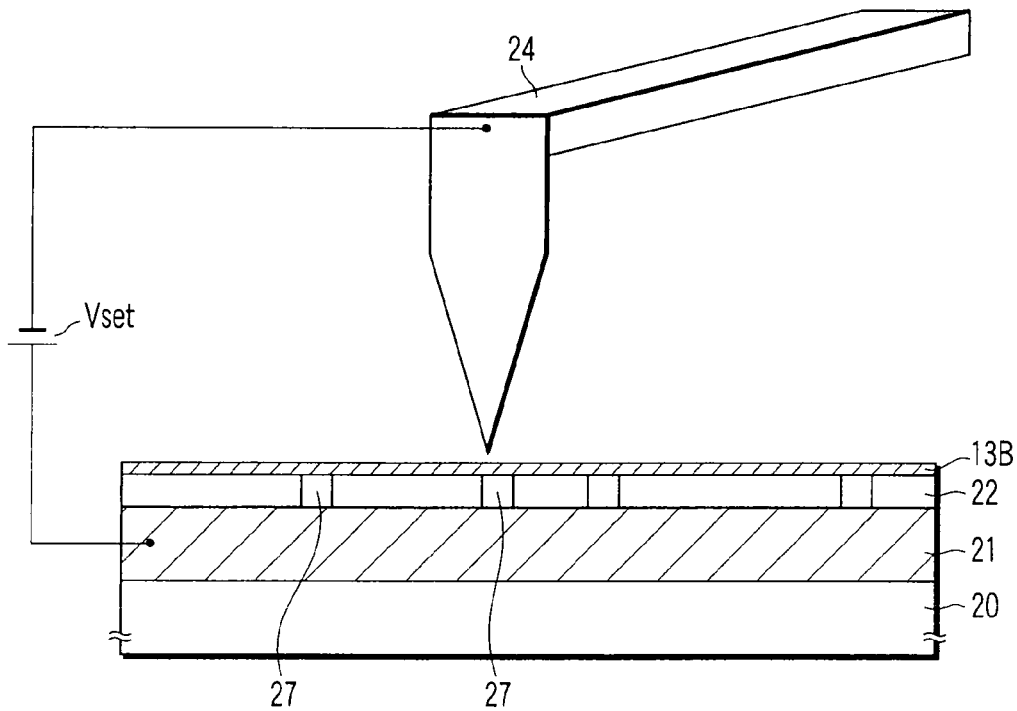
FIG. 6 is a view showing how probe memory recording is made.

FIG. 6 shows a state established at the time of recording operation (set operation).

A recording medium is assumed to be configured by an electrode layer 21 placed on a substrate 20 (for example, semiconductor chip), a recording layer 22 placed on the electrode 21, and a protective layer 13B placed on the recording layer 22. The protective layer 13B is constituted by, for example, a thin insulator.

A recording operation is achieved in such a manner that a voltage is applied to a recording bit 27 of the recording layer 22 to generate a potential gradient at the inside of the recording bit 27. Specifically, a current/voltage pulse may be applied to the recording bit 27.

First Example

A first example shows a case of using the material shown in FIG. 1 for the recording layer.

Figure 7:
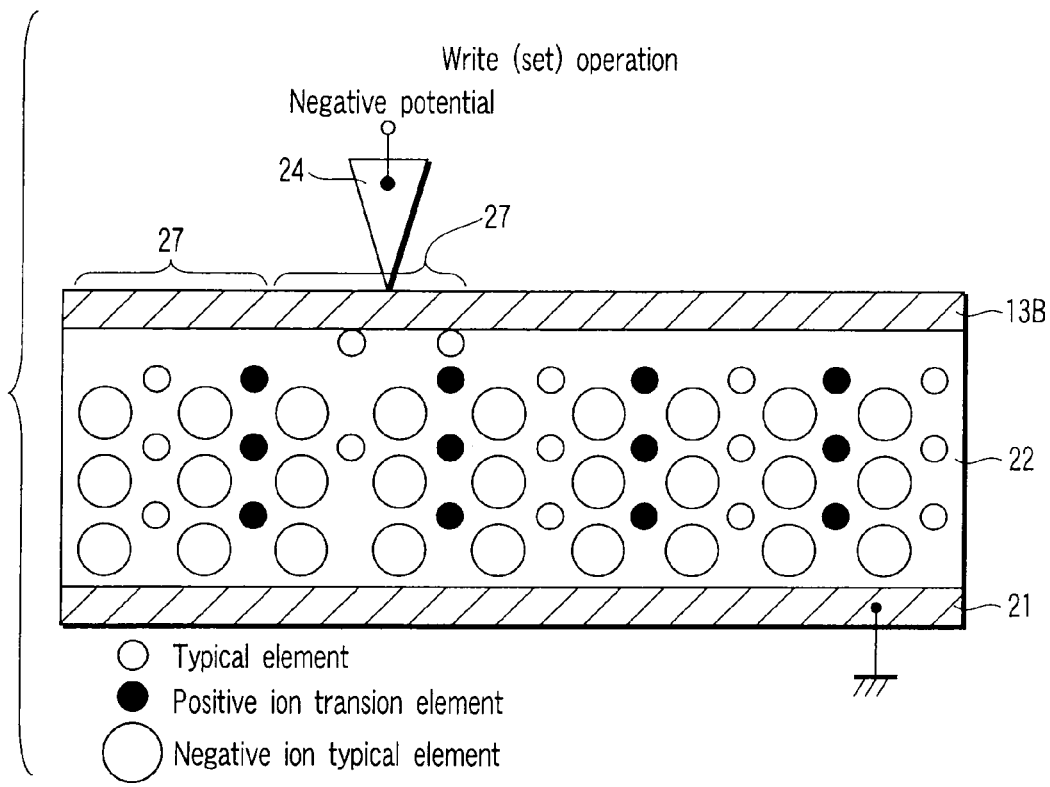
FIG. 7 is a diagram showing a write operation.

First, as shown in FIG. 7, a state in which a potential of the probe 24 is relatively lower than that of the electrode layer 21 is produced. Assuming that the electrode layer 21 is set at a fixed potential (for example, grounding potential), a negative potential may be applied to the probe 24.

A current pulse is generated by discharging electrons from the probe 24 toward the electrode layer 21 while using, for example, an electron generating source or a hot electron source.

At this time, for example, in the recording bit 27 of the recording layer 22, some of positive ions move to the side of the probe (cathode) 24, and the positive ions in crystal relatively decrease with respect to negative ions. In addition, the positive ions having moved to the side of the probe 24 precipitate as a metal upon the receipt of electrons from the probe 24.

In the recording bit 27, the negative ions become excessive, and as a result, the valence number of transition elements in the recording bit 27 is increased. Namely, the recording bit 27 has electron conductivity due to carrier implementation caused by a phase change, and thus, the recording operation (set operation) completes.

A recording current pulse can be also generated by producing a state in which the potential of the prove 24 is relatively higher than that of the electrode layer 21.

Figure 8:
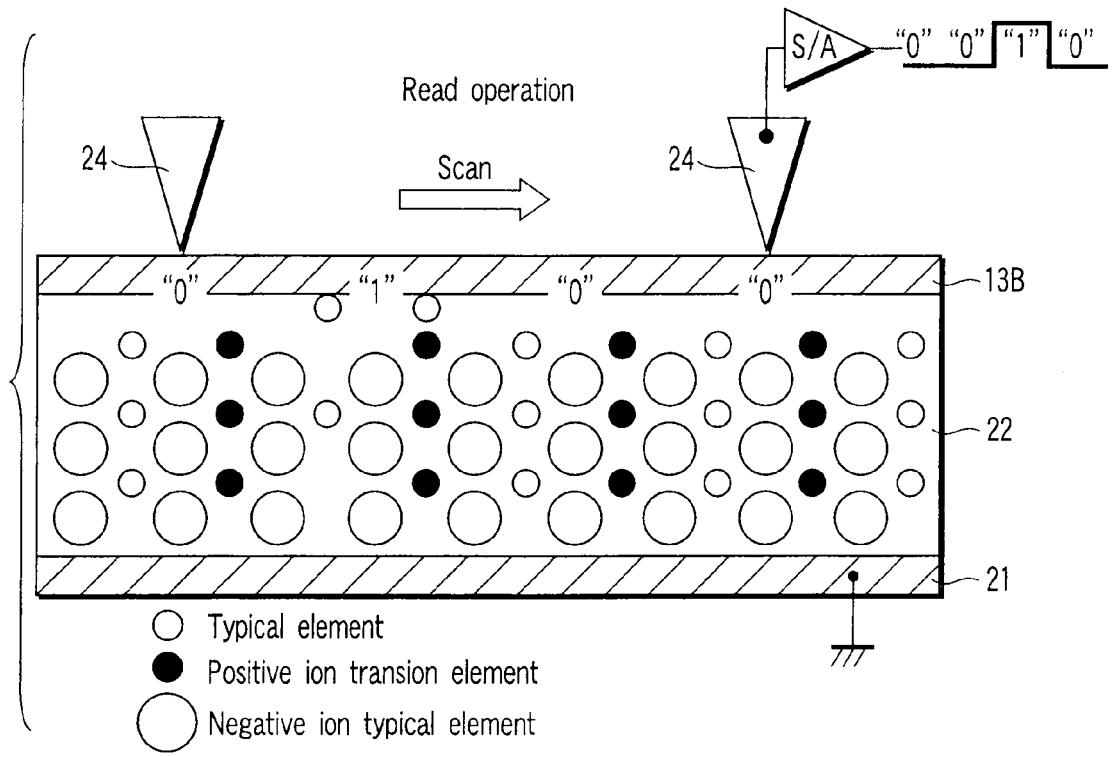
FIG. 8 is a diagram showing a read operation.

FIG. 8 shows a reproducing operation.

The reproducing operation is achieved in such a manner that a current pulse is supplied to the recording bit 27 of the recording layer 22 to detect a resistance value of the recording bit 27. However, the current pulse is obtained as a very small value to such an extent that a material configuring the recording bit 27 of the recording layer 22 does not cause a resistance change.

For example, a read current (current pulse) generated by a sense amplifier S/A is supplied from the probe 24 to the recording bit 27, and then, the resistance value of the recording bit 27 is measured by the sense amplifier S/A.

A difference in resistance value between the set and reset states can be allocated to be equal to or greater than $10^3$ by using the material according to the example of the invention.

In the reproducing operation, the top of the recording medium is scanned with the probe 24, thereby enabling continuous reproduction.

An erasure (reset) operation is achieved by Joule-heating the recording bit 27 of the recording layer 22 with a mass current pulse to promote oxidizing/reducing reaction in the recording bit 27.

The erasure operation can be achieved for each recording bit 27 or can be achieved by a plurality of recording bits 27 or on a block by block basis.

Second Example

A second example shows a case of using the material shown in FIG. 2 for the recording layer.

Figure 9:
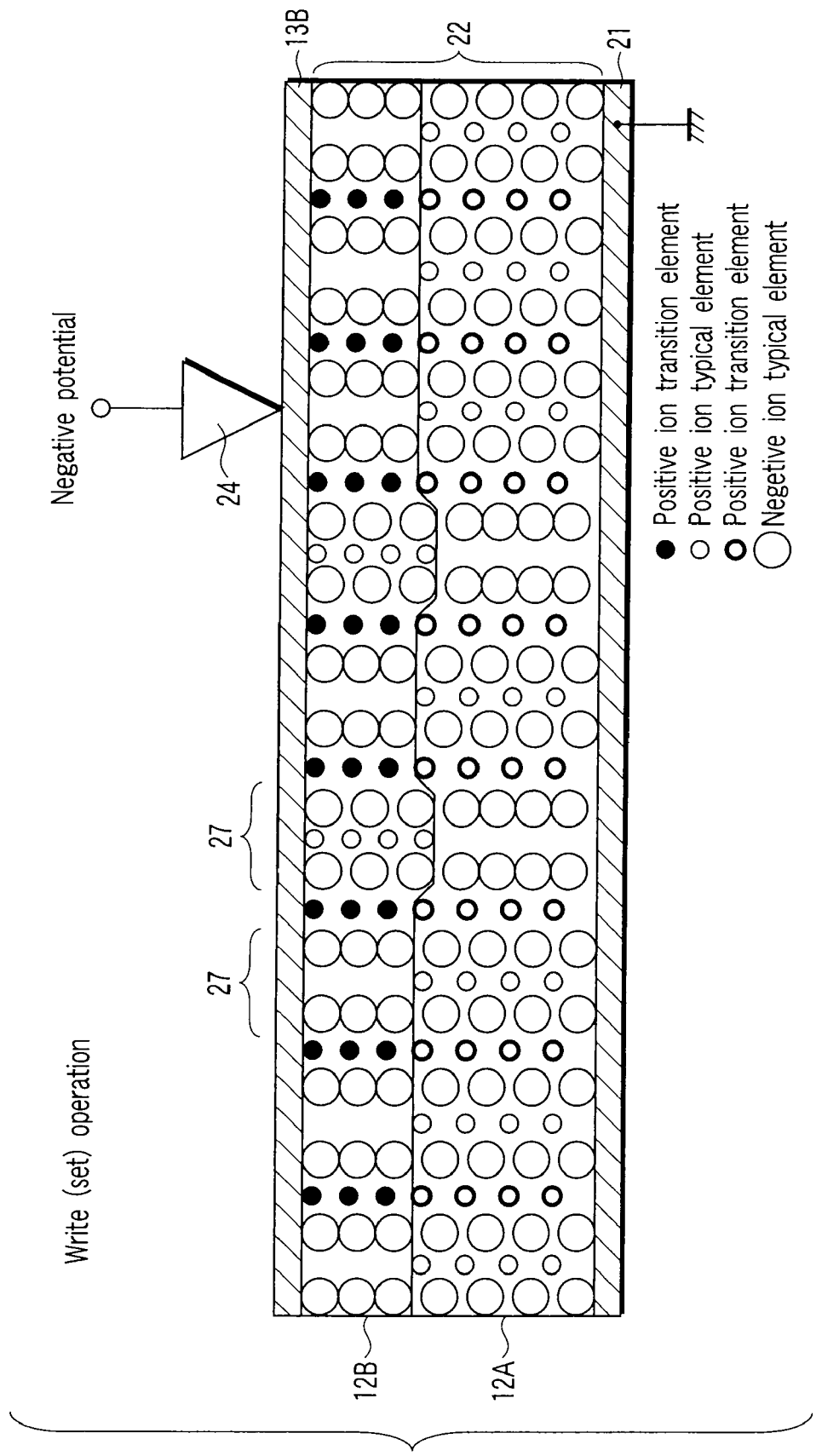
FIG. 9 is a diagram showing a write operation.

FIGS. 6 and 9 each show a state established at the time of recording/erasing operation.

It is assumed that a recording medium is composed of: an electrode layer 21 on a substrate 20 (for example, semiconductor chip); a recording layer 22 on the electrode layer 21; and a protecting layer 13B on the recording layer 22. The protecting layer 13B is composed of a thin insulation element, for example.

The recording operation is carried out by applying a voltage to a recording bit 27 of the recording layer 22, and then, generating an electric potential gradient in the inside of the recording bit 27. Specifically, a current/voltage pulse may be applied to the recording bit 27.

In this example, there is produced a state in which an electric potential of a probe 24 is relatively higher than that of the electrode layer 21. Assuming that the electrode layer 21 is defined as a fixed electric potential (for example, grounding electric potential), a positive electric potential may be applied to the probe 24.

At this time, part of the positive ion element in a first compound (anode side) of the recording layer 22 moves in a crystal, and is housed in a cavity site of a second compound (cathode side).

Concurrently, the valence of the positive ion (transition element) in the first compound increases, and then, the valence of the positive ion (transition element) in the second compound decreases. As a result, the recording bit 27 of the recording layer 22 changes from a high resistance state to a low resistance state, and a set operation (recording) is completed.

An erasing operation produces a state in which the electric potential of the probe 24 is relatively lower than that of the electrode layer 21. Assuming that the electrode layer 21 is defined as a fixed electric potential (for example, grounding electric potential), a negative electric potential may be applied to the probe 24.

At this time, part of the positive ion element in a second compound (anode side) of the recording layer 22 moves in a crystal, and is housed in a cavity site of a first compound (cathode side).

Concurrently, the valence of the positive ion (transition element) in the second compound increases, and then, the valence of the positive ion (transition element) in the first compound decreases. As a result, the recording bit 27 of the recording layer 22 changes from the low resistance state to the high resistance state, and the reset operation (erasing) is completed.

With respect to the recording/erasing operation, by reversing a positional relationship between the first and second compounds, the electric potential of the probe 24 is relatively lower than that of the electrode layer 21, and then, the set operation can be executed.

Figure 10:
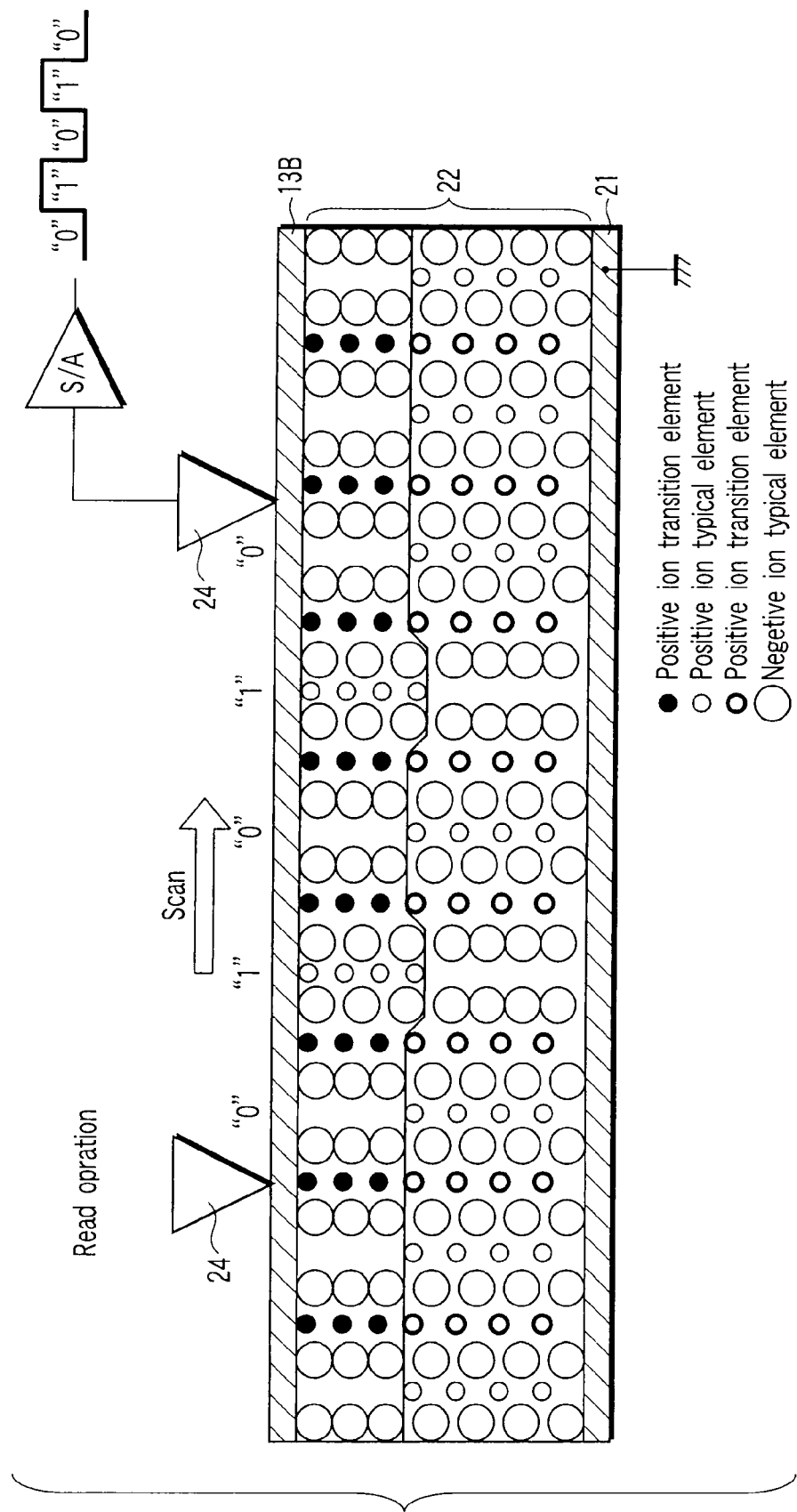
FIG. 10 is a diagram showing a read operation.

FIG. 10 shows a state established at the time of reproduction.

A reproducing operation is carried out by supplying a current pulse to the recording bit 27, and then, detecting a resistance value of the recording bit 27. However, the current pulse is set at a very small value to an extent that a material configuring the recording bit 27 does not cause a resistance change.

For example, a readout current (current pulse) generated by means of a sense amplifier S/A is supplied from the probe 24 to the recording layer (recording bit) 22, and a resistance value of the recording bit is measured by means of the sense amplifier S/A. When the new materials described previously are employed, a difference in resistance values of the set/reset states can be allocated to be $10^3$ or more.

The reproducing operation can be continuously carried out by scanning the prove 24.

C. Conclusion

According to such a probe memory, high recording density and low power consumption can be achieved more effectively than a current hard disk or a flash memory.

(2) Semiconductor Memory

A. Structure

FIG. 11 shows a cross-point type semiconductor memory according to an example of the present invention.

Word lines WLi−1, WLi, and WLi+1 extend in an X direction, and bit lines BLj−1, BLj, and BL+j+1 extend in a Y direction.

One end of each of the word lines WLi−1, WLi, and WLi+1 is connected to a word line driver & decoder 31 via a MOS transistor RSW serving as a selector switch, and one end of each of the bit lines BLj−1, BLj, and BLj+1 is connected to a bit line driver & decoder & readout circuit 32 via a MOS transistor CSW serving as a selector switch.

Selector signals Ri−1, Ri, and Ri+1 for selecting one word line (row) are inputted to a gate of the MOS transistor RSW, and selector signals Cj−1, Cj, and Cj+1 for selecting one bit line (column) are inputted to a gate of the MOS transistor CSW.

A memory cell 33 is allocated at a crossing portion between each of the word lines WLi−1, WLi, and WLi+1 and each of the bit lines BLj−1, BLj, and BLj+1. A so called cross-point type cell array structure is provided.

A diode 34 for preventing a sneak current at the time of recording/reproducing operation is added to the memory cell 33.

Figure 12:
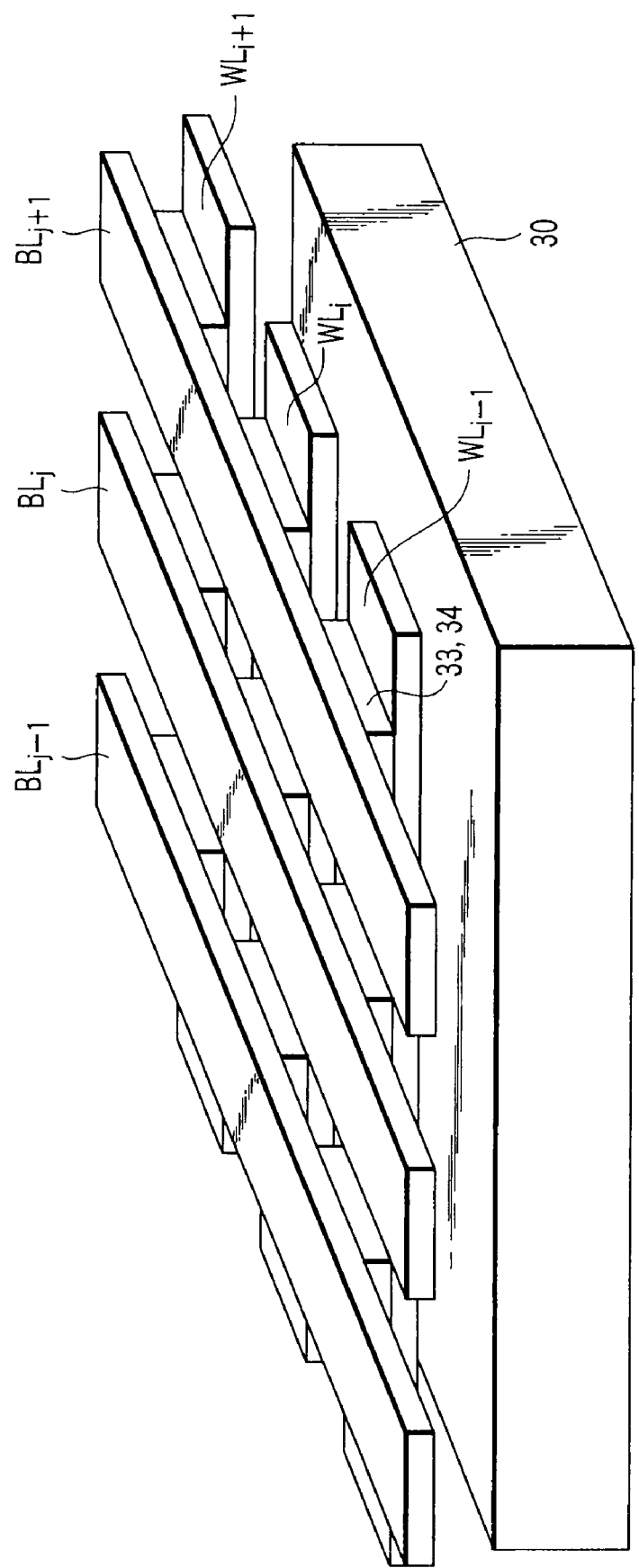
FIG. 12 is a view showing an example of a memory cell array structure.

FIG. 12 shows a structure of a memory cell array portion of the semiconductor memory shown in FIG. 11.

Word lines WLi−1, WLi, and WLi+1 and bit lines BLi−1, BLj, and BLj+1 are allocated on a semiconductor chip 30, and the memory cell 33 and the diode 34 are allocated at a crossing portion of these lines.

Figure 14:
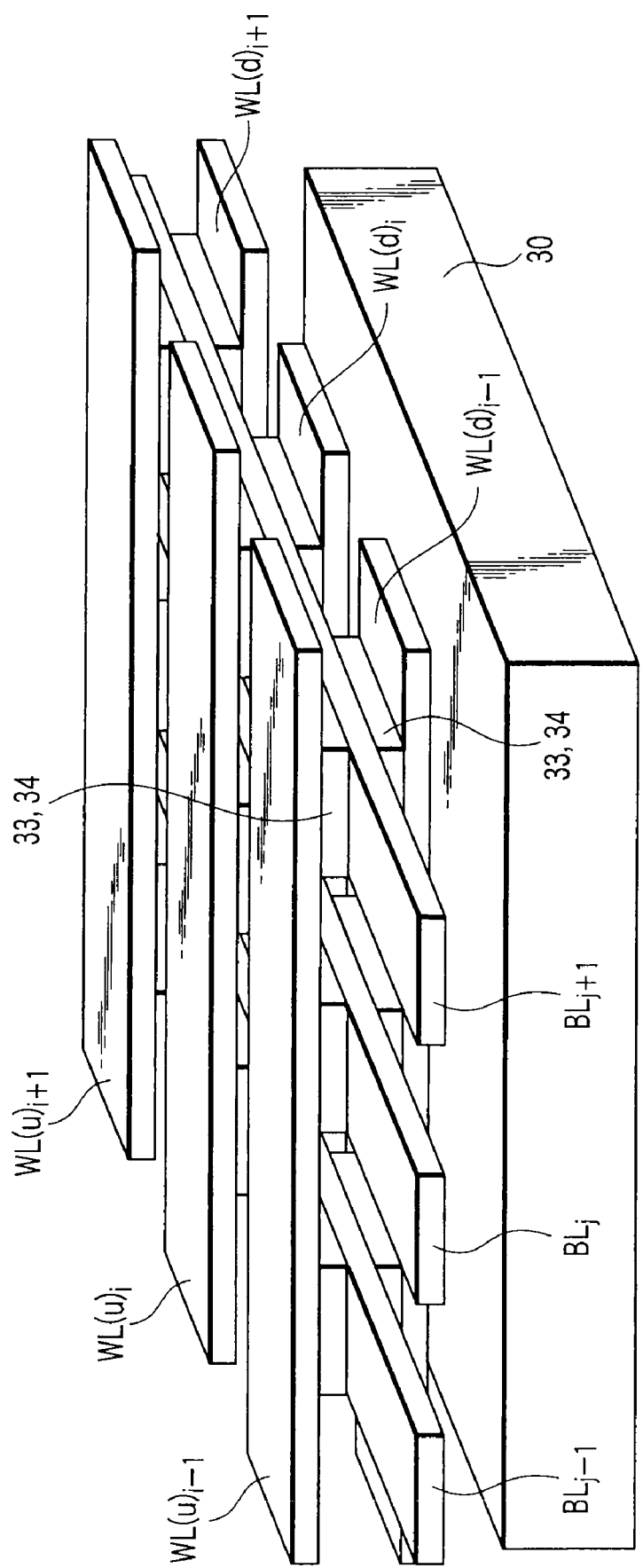
FIG. 14 is a view showing an example of a memory cell array structure.
Figure 15:
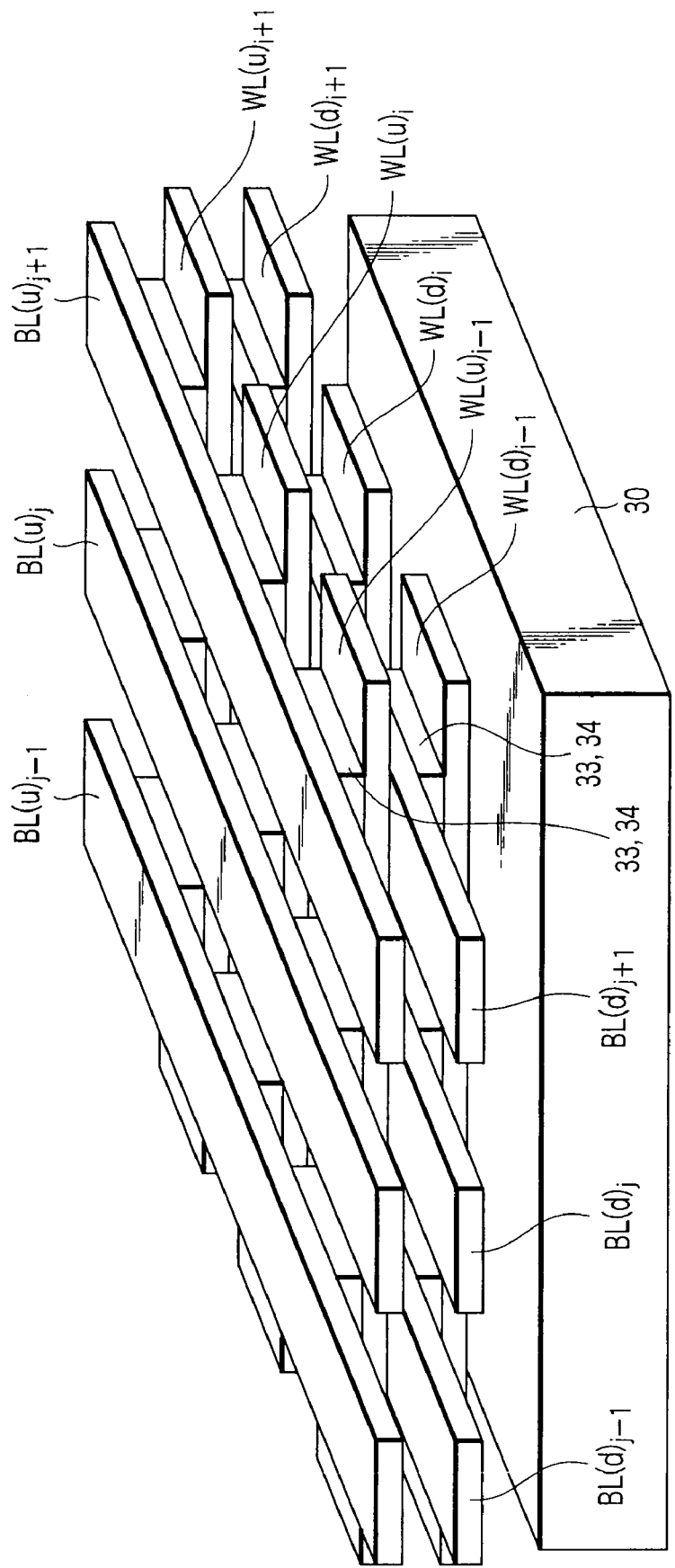
FIG. 15 is a view showing an example of a memory cell array structure.

A feature of such a cross-point type cell array structure is that the structure is advantageous for high integration because there is no need to individually connect a MOS transistor to the memory cell 33. For example, as shown in FIGS. 14 and 15, it is possible to laminate the memory cells 33, thereby providing the memory cell array in a three-dimensional structure.

Figure 13:
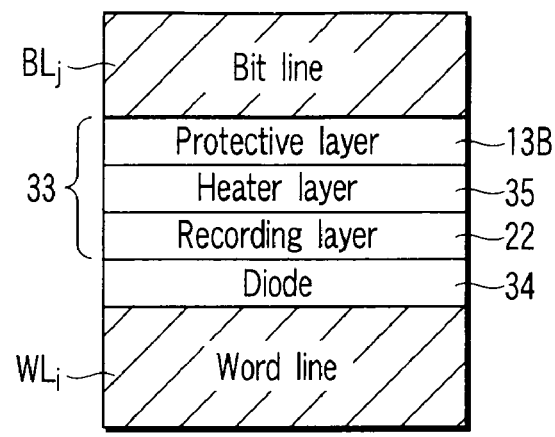
FIG. 13 is a view showing an example of a memory cell structure.

The memory cell 33, for example, as shown in FIG. 13, is composed of a stacked structure of a recording layer 22, a protecting layer 13B, and a heater layer 35. 1-bit data is stored by one memory cell 33. In addition, the diode 34 is allocated between the word line WLi and the memory cell 33.

It is preferable to eliminate the diode 34 in the case where set/reset is changed by only a voltage orientation.

B. Write, Erase, and Readout Operations

Write, erase, and readout operations will be described with reference to FIGS. 11 to 13.

Here, it is assumed that a memory cell 33 enclosed by dotted line A is selected, and then, the write, erase, and readout operations are executed for the selected memory cell.

First Example

A first example shows a case of using the material shown in FIG. 1 for the recording layer.

A recording operation (set operation) may be achieved such that a voltage is applied to a selected memory cell 33, and a potential gradient is generated in the memory cell 33 to supply a current pulse. Thus, for example, a state in which a potential of a word line WLi is relatively lower than that of a bit line BLj is produced. Assuming that the bit line BLj is set at a fixed potential (for example, grounding potential), a negative potential may be applied to the word line WLi.

At this time, in the selected memory cell 33 enclosed by the dotted line A, some of positive ions move to the side of the word line (cathode) WLi, and the positive ions contained in crystal relatively decrease with respect to the negative ions. The positive ion having moved to the side of the word lines WLi precipitate as a metal upon the receipt of electrons from the word line WLi.

In the selected memory cell 33 enclosed by the dotted line A, the negative ions become excessive, and as a result, the valence number of transition elements contained in crystal is increased. Namely, the selected memory cell 33 enclosed by the dotted line A has electron conductivity due to carrier implantation caused by a phase change, and thus, the recording operation (set operation) completes.

At the time of the recording operation, it is preferable to bias all the unselected word lines WLi−1, WLi+1 and unselected bit lines BLj−1, BLj+1 to the same potential.

In addition, at the time of a standby state before recording, it is preferable to pre-charge all the word lines WLi−1, WLi, and WLi+1 and all the bit lines BLj−1, BLj, and BLj+1.

A recording current pulse may be generated by producing a state in which a potential of the word line WLi is relatively higher than that of the bit line BLj.

A reproducing operation is achieved by supplying a current pulse to the selected memory cell 33 enclosed by the dotted line A, and detecting a resistance value of the memory cell 33. However, there is a need for the current pulse to be obtained as a very small value to such an extent that a material configuring the memory cell 33 does not cause a resistance change.

For example, a readout current (current pulse) generated by a readout circuit is supplied from the bit line BLj to the memory cell 33 enclosed by the dotted line A, and then, a resistance value of the memory cell 33 is measured by the readout circuit. By employing the new material described previously, a difference in resistance value between the set and reset states can be allocated to be equal to or greater than $10^3$.

An erasure (reset) operation is achieved by Joule-heating the selected memory cell 33 enclosed by the dotted line A with a mass current pulse to promote an oxidizing/reducing reaction in the memory cell 33.

Second Example

A second example shows a case of using the material shown in FIG. 2 for the recording layer.

In the write operation (set operation), a voltage is applied to the selected memory cell 33, whereby a current pulse may be supplied while an electric potential gradient is generated in that memory cell 33. Thus, for example, an electric potential of the word line WLi is relatively higher than that of the bit line BLj. A positive electric potential may be applied to the word line WLi, when the bit line BLj is defined as a fixed electric potential (for example, grounding electric potential).

At this time, in the selected memory cell 33 encoded by the dotted line A, part of the positive ion in a first compound moves into a cavity area of a second compound. Thus, the valence of the positive ion (transition element) in the first compound increases, and then, the valence of the positive ion (transition element) in the second compound decreases.

As a result, the memory cell 33 changes from a high resistance state to a low resistance state, and a set operation (write) is completed.

At the time of the write operation, it is preferable to bias all of unselected word lines WLi−1 and WLi+1 and unselected bit lines BLj−1 and BLj+1 to the same electric potential.

In addition, at the time of a standby state before the write operation, it is preferable to pre-charge all of the word lines WLi−1, WLi, and WLi+1 and all of the bit lines BLj−1, BLj, and BLj+1.

An erasing operation (reset operation) utilizes a Joule heat and its residual heat, the Joule heat being generated by supplying a mass current pulse to the selected memory cell 33. Thus, for example, an electric potential of the word line WLi is relatively higher than that of the bit line BLj. A positive electric potential may be applied to the word line WLi, when the bit line BLj is defined as a fixed electric potential (for example, grounding electric potential).

At this time, in the selected memory cell 33 enclosed by the dotted line A, part of the positive ion in the second compound moves into a cavity area of the first compound. Thus, the valence of the positive ion (transition element) in the second compound increases, and then, the valence of the positive ion (transition element) in the first compound decreases.

As a result, the memory cell 33 changes from a low resistance state to a high resistance state, and a reset operation (erase) is completed.

Here, the erasing operation can also be carried out by the following method. However, in this case, as described above, it is preferable to remove the diode 34 from the semiconductor memory shown in FIGS. 8 and 9.

For example, an electric potential of the word line WLi is relatively lower than that of the bit line BLj. A negative electric potential may be applied to the word line WLi, when the bit line BLj is defined as a fixed electric potential (for example, grounding electric potential).

At this time, in the selected memory cell 33 enclosed by the dotted line A, part of the positive ion in the second compound moves into a cavity area of the first compound. Thus, the valence of the positive ion (transition element) in the second compound increases, and then, the valence of the positive ion (transition element) in the first compound decreases.

As a result, the memory cell 33 changes from a low resistance state to a high resistance state, and a reset operation (erase) is completed.

At the time of the erasing operation as well, it is preferable to bias all of the unselected word lines WLi−1 and WLi+1 and unselected bit lines BLj−1 and BLj+1 to the same electric potential.

In addition, at the time of a standby state before the erasing operation, it is preferable to pre-charge all of the word lines WLi−1, WLi, and WLi+1 and all of the bit lines BLj−1, BLj, and BLj+1.

A readout operation is carried out by supplying a current pulse to the memory cell 33 enclosed by the dotted line A, and then, detecting a resistance value of that memory cell 33. However, it is necessary that the current pulse be set at a very small value to an extent that a material configuring the memory cell 33 does not cause a resistance change.

For example, a readout current (current pulse) generated by means of a readout current is supplied from the bit line BLj to the memory cell 33 encoded by the dotted line A, and then, a resistance value of that memory cell 33 is measured by means of the readout circuit. By employing the new material described previously, a difference in resistance values of the set/reset states can be allocated to be $10^3$ or more.

C. Conclusion

According to such a semiconductor memory, it is possible to achieve higher recording density and lower power consumption than those of current hard disks or flash memories.

(3) Others

While the present embodiment has described two memories, i.e., the probe memory and the semiconductor memory, it is also possible to apply the material and principle proposed in the example of the invention to a recording medium such as a current hard disk or DVD.

4. Manufacturing Method

A description will be given with respect to a method of manufacturing a recording medium according to an example of the present invention.

Here, a structure of the recording medium shown in FIG. 6 will be described by way of example.

A substrate 20 is provided as a disk of about 60 mm in diameter and about 1 mm in thickness, made of a glass. On the substrate 20, an electrode layer 21 is formed by vapor depositing Pt (platinum) with thickness of about 500 nm.

On the electrode layer 21, first, RF magnetron sputtering is carried out in an atmosphere of 300° C. to 600° C. in temperature, Ar (argon) 95%, and O (oxygen) 25% by using a target whose composition has been adjusted such that $ZnMn_2O_4$ is deposited, thereby forming $ZnMn_2O_4$ having a thickness of about 10 nm configuring part of the recording layer 22.

Subsequently, $TiO_2$ having a thickness of about 3 nm is formed on $ZnMn_2O_4$ in accordance with the RF magnetron sputtering. As a result, the recording layer 22 has a laminate structure of $ZnMn_2O_4$ and $TiO_2$.

Lastly, a protective layer 13B is formed on the recording layer 22 to complete a recording medium as shown in FIG. 6.

5. Experiment Examples

A description will be given with respect to experiment examples in which some samples are prepared and a resistance difference between a reset (erasure) state and a set (write) state is evaluated.

A recording medium having the structure shown in FIG. 6 is used as a sample.

Evaluation is made by using a probe pair with a diameter of its distal end sharpened at 10 nm or less.

Such a probe pair is made into contact with the protective layer 13B, and write/erasure operation is executed by using one of the probe pair. The write operation is achieved by applying, for example, a voltage pulse of 1V at the width of 10 nsec to the recording layer 22. The erasure operation is made by applying, for example, a voltage pulse of 0.2V at the width of 100 nsec to the recording layer 22.

Further, a read operation is executed between the write operation and the erasure operation by using the other of the probe pair. The read operation is made by applying a voltage pulse of 0.1V at the width of 10 nsec to the recording layer 22, and measuring a resistance value of the recording layer (recording bit) 22.

(1) First Experiment Example

Samples of a first experiment example are as follows.

An electron layer 21 is produced as a Pt film formed at a thickness of about 500 nm on a disk. A recording layer 22 is produced as $ZnV_2O_4$, and a protective layer 13B is provided as a diamond-like carbon (DLC).

A disk temperature is maintained at a value ranging from 300° C. to 500° C., for example, and then, RF magnetron sputtering is carried out in an atmosphere of 95% in Ar and 5% in $O_2$, whereby, $ZnV_2O_4$ is formed at a thickness of about 10 nm on the disk. The diamond-like carbon is formed at a thickness of about 3 nm on $ZnV_2O_4$ in accordance with, for example, a CVD technique.

A resistance value after a write operation was in order of $10^3\Omega$, a resistance value after an erasure operation was in order of $10^7\Omega$, and a resistance difference therebetween was about $10^4\Omega$. It was verified that a sufficient margin could be allocated at the time of read operation.

(2) Second Experiment Example

In a second experiment example, the same samples as those used in the first example are used except that a recording layer is made of $ZnCr_2O_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(3) Third Experiment Example

In a third experiment example, the same samples as those used in the first example are used except that a recording layer is made of $ZnMn_2O_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(4) Fourth Experiment Example

In a fourth experiment example, the same samples as those used in the first example are used except that a recording layer is made of $ZnCo_2O_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(5) Fifth Experiment Example

In a fifth experiment example, the same samples as those used in the first example are used except that a recording layer is made of $MgCr_2O_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(6) Sixth Experiment Example

In a sixth experiment example, the same samples as those used in the first example are used except that a recording layer is made of $MgMn_2O_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(7) Seventh Experiment Example

In a seventh experiment example, the same samples as those used in the first example are used except that a recording layer is made of $MgCo_nO_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(8) Eighth Experiment Example

In an eighth experiment example, the same samples as those used in the first example are used except that a recording layer is made of $CoMn_nO_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(9) Ninth Experiment Example

In a ninth experiment example, the same samples as those used in the first example are used except that a recording layer is made of $CaCr_nO_4$.

Resistance values after write/erasure operations were in order of $10^3\Omega/10^7\Omega$ as in the first experiment example, and a

(10) Tenth Experiment Example

In a tenth experiment example, the same samples as those used in the first example are used except that a recording layer is made of $CaMn_nO_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(11) Eleventh Experiment Example

In an eleventh experiment example, the same samples as those used in the first example are used except that a recording layer is made of $SrMn_nO_4$.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(12) Twelfth Experiment Example

In a twelfth experiment example, the same samples as those used in the first experiment example are used except that a recording layer is made of a laminate of $Ba_{0.25}Mn_2O_4$ and Ba. $Ba_{0.25}Mn_2O_4$ is formed in accordance with a sputtering technique, and Ba is formed at a thickness of about 10 nm.

Resistance values after write/erasure operations were in order of $10^3\Omega/10^7\Omega$ as in the first experiment example, and a resistance difference therebetween was about $10^4\Omega$. It was verified that a sufficient margin could be allocated at the time of a read operation.

(13) Thirteenth Experiment Example

In a thirteenth experiment example, the same samples as those used in the first experiment example are used except that a recording layer is made of a laminate of $Zn_{0.25}Mn_2O_4$ and Zn. $Zn_{0.25}Mn_2O_4$ is formed in accordance with a sputtering technique, and Zn is formed at a thickness of about 10 nm.

While a resistance value in an initial state was in order of $10^8\Omega$, a resistance value after a write operation was in order of $10^3$, and further, a resistance value after an erasure operation was in order of $10^7\Omega$. A resistance difference between the write and erasure operations was $10^4\Omega$ to $10^5\Omega$. It was verified that a sufficient margin could be allocated at the time of a read operation.

(14) Fourteenth Experiment Example

In a fourteenth experiment example, the same samples as those used in the first experiment example are used except that a recording layer is made of $CuA_2$.

While a resistance value in an initial state was in order of $10^8\Omega$, a resistance value after a write operation was in order of $10^3$, and further, a resistance value after an erasure operation was in order of $10^6\Omega$. A resistance difference between the write and erasure operations was $10^3\Omega$ to $10^5\Omega$. It was verified that a sufficient margin could be allocated at the time of a read operation.

(15) Fifteenth Experiment Example

In a fifteenth experiment example, the same samples as those used in the first experiment example are used except that a recording layer is made of $MgCrO_3$.

While a resistance value in an initial state was in order of $10^7\Omega$, a resistance value after a write operation was in order of $10^3$, and further, a resistance value after an erasure operation was in order of $10^6\Omega$. A resistance difference between the write and erasure operations was $10^3\Omega$ to $10^4\Omega$. It was verified that a sufficient margin could be allocated at the time of a read operation.

(16) Sixteenth Experiment Example

In s sixteenth experiment example, the same samples as those used in the first experiment example are used except that a recording layer is made of $NiWN_2$, and a protective layer is made of $SnO_2$. $NiWN_2$ is formed in a sputtering technique in an atmosphere of 95% in Ar and 35% in NH.

While a resistance value in an initial state was in order of $10^7\Omega$, a resistance value after a write operation was in order of $10^3$, and further, a resistance value after an erasure operation was in order of $10^6\Omega$. A resistance difference between the write and erasure operations was $10^2\Omega$ to $10^5\Omega$. It was verified that a sufficient margin could be allocated at the time of a read operation.

(17) Seventeenth Experiment Example

In a seventeenth experiment example, the same samples as those used in the first experiment example are used except that a recording layer is made of $Zn_{1.2}V_{1.8}O_4$, and a protective layer is made of $SnO_2$.

While a resistance value in an initial state was in order of $10^6\Omega$, a resistance value after a write operation was in order of $10^2$, and further, a resistance value after an erasure operation was in order of $10^6\Omega$. A resistance difference between the write and erasure operations was about $10^4\Omega$. It was verified that a sufficient margin could be allocated at the time of a read operation.

(18) Eighteenth Experiment Example

In an eighteenth experiment example, the same samples as those used in the first experiment example are used except that a recording layer is made of $Zn_{1.2}Cr_{1.8}O_4$, and a protective layer is made of $SnO_2$.

While a resistance value in an initial state was in order of $10^6\Omega$, a resistance value after a write operation was in order of $10^2$, and further, a resistance value after an erasure operation was in order of $10^6\Omega$. A resistance difference between the write and erasure operations was about $10^4\Omega$. It was verified that a sufficient margin could be allocated at the time of a read operation.

(19) Nineteenth Experiment Example

In a nineteenth experiment example, the same samples as those used in the first experiment example are used except that a recording layer is made of $ZnAl_{1.8}Cr_{0.2}O_4$, and a protective layer is made of $SnO_2$.

While a resistance value in an initial state was in order of $10^8\Omega$, a resistance value after a write operation was in order of $10^3$, and further, a resistance value after an erasure operation was in order of $10^8\Omega$. A resistance difference between the write and erasure operations was about $10^5\Omega$. It was verified that a sufficient margin could be allocated at the time of a read operation.

(20) Twentieth Experiment Example

In a twentieth experiment example, the same samples as those used in the first experiment example are used except that a recording layer is made of $ZnAl_{1.8}Mn_{0.2}O_4$, and a protective layer is made of $SnO_2$.

While a resistance value in an initial state was in order of $10^8\Omega$, a resistance value after a write operation was in order of $10^3$, and further, a resistance value after an erasure operation was in order of $10^8\Omega$. A resistance difference between the write and erasure operations was about $10^5\Omega$. It was verified that a sufficient margin could be allocated at the time of a read operation.

(21) Twenty-First Experiment Example

In a twenty-first experiment example, the same samples as those used in the first experiment example are used except that a recording layer is made of $SiNi_2O_4$, and a protective layer is made of $SnO_2$.

While a resistance value in an initial state was in order of $10^8\Omega$, a resistance value after a write operation was in order of $10^3$, and further, a resistance value after an erasure operation was in order of $10^8\Omega$. A resistance difference between the write and erasure operations was about $10^5\Omega$. It was verified that a sufficient margin could be allocated at the time of a read operation.

(22) Twenty-Second Experiment Example

In a twenty-second experiment example, the same samples as those used in the first experiment example are used except that a recording layer is made of $SeNi_2O_4$, and a protective layer is made of $SnO_2$.

While a resistance value in an initial state was in order of $10^8\Omega$, a resistance value after a write operation was in order of $10^3$, and further, a resistance value after an erasure operation was in order of $10^8\Omega$. A resistance difference between the write and erasure operations was about $10^5\Omega$. It was verified that a sufficient margin could be allocated at the time of a read operation.

(23) Twenty-Third Experiment Example

In a twenty-third experiment example, the same samples as those used in the first experiment example are used except that a recording layer is made of $NiTiO_3$, and a protective layer is made of $SnO_2$.

While a resistance value in an initial state was in order of $10^8\Omega$, a resistance value after a writing operation was in order of $10^3$, and further, a resistance value after an erasure operation was in order of $10^8\Omega$. A resistance difference between write and erasure operations was about $10^5\Omega$. It was verified that a sufficient margin could be allocated at the time of a read operation.

(24) Twenty-Fourth Experiment Example

The specification of the samples in a twenty-fourth experiment example is as follows.

A recording layer 22 is composed of a laminate structure of $ZnMn_2O_4$ having a thickness of about 10 nm and $TiO_2$ having a thickness of about 3 nm.

In this case, a result was obtained, indicating that a resistance value of a reset state was in order of $10^7\Omega$, and a resistance value in a set state was in order of $10^3\Omega$. In addition, It was verified that the cycle service life could be achieved to be equal to or greater than 100,000 cycles.

(25) Twenty-Fifth Experiment Example

The specification of the samples in a twenty-fifth experiment example is as follows.

A recording layer 22 is composed of a laminate structure of $ZnMn_2O_4$ having a thickness of about 10 nm and $TiO_2$ having a thickness of about 3 nm.

In this case, a result was obtained, indicating that a resistance value of a reset state was in order of $10^7\Omega$, and a resistance value in a set state was in order of $10^3\Omega$. In addition, it was verified that the cycle service life could be achieved to be equal to or greater than 100,000 cycles.

(26) Twenty-Sixth Experiment Example

The specification of the samples in a twenty-sixth experiment example is as follows.

A recording layer 22 is composed of a laminate structure of $MgMn_2O_4$ having a thickness of about 10 nm and $TiO_2$ having a thickness of about 3 nm.

In this case, a result was obtained, indicating that a resistance value of a reset state was in order of $10^7\Omega$, and a resistance value in a set state was in order of $10^3\Omega$. In addition, it was verified that the cycle service life could be achieved to be equal to or greater than 100,000 cycles.

(27) Twenty-Seventh Experiment Example

The specification of the samples in a twenty-seventh experiment example is as follows.

A recording layer 22 is composed of a laminate structure of $ZnMn_2O_4$ having a thickness of about 10 nm and $ZrO_3$ having a thickness of about 3 nm.

In this case, a result was obtained, indicating that a resistance value of a reset state was in order of $10^7\Omega$, and a resistance value in a set state was in order of $10^3\Omega$. In addition, it was verified that the cycle service life could be achieved to be equal to or greater than 100,000 cycles.

(28) Twenty-Eighth Experiment Example

The specification of samples in a twenty-eighth experiment example is as follows.

A recording layer 22 is composed of a laminate structure of $SrMoO_3$ having a thickness of about 10 nm and $ReO_3$ having a thickness of about 3 nm.

In this case, a result was obtained, indicating that a resistance value of a reset state was in order of $10^7\Omega$, and a resistance value in a set state was in order of $10^3\Omega$. In addition, it was verified that the cycle service life could be achieved to be equal to or greater than 100,000 cycles.

(29) Comparative Example

The specification of the samples in Comparative Example is as follows.

A recording layer 22 is composed of only $ZnMn_2O_4$ having a thickness of about 10 nm.

In this case, a resistance value in a reset state was in order of $10^7\Omega$ and a resistance value in a set state was in order of $10^3\Omega$, as in the first to fifth experiment examples.

However, the cycle service life was in order of 100 cycles, and it was verified that the structures according to examples of the present invention were effective for a repetitive rewriting operation.

(30) Conclusion

As described above, in the samples of any of the first to twenty-eighth experiment examples, basic operations of write, erasure, and read operations can be made.

Table 1 shows a summary of verification results of the first to twenty-eighth experiment examples and comparative examples.

TABLE 1

| | Material for recording layer | Crystalline structure | Protective layer | Initial Resistance value [$\Omega$] | Resistance value after recording [$\Omega$] | Resistance value after erasure [$\Omega$] |
|---|---|---|---|---|---|---|
| First experiment example | $ZnV_2O_4$ | Spinel | DLC | $10^7$ | $10^3$ | $10^7$ |
| Second experiment example | $ZnCr_2O_4$ | Spinel | DLC | $10^7$ | $10^3$ | $10^7$ |
| Third experiment example | $ZnMn_2O_4$ | Spinel (Heterolite) | DLC | $10^7$ | $10^3$ | $10^7$ |
| Fourth experiment example | $ZnCo_2O_4$ | Spinel | DLC | $10^7$ | $10^3$ | $10^7$ |
| Fifth experiment example | $MgCr_2O_4$ | Spinel | DLC | $10^7$ | $10^3$ | $10^7$ |
| Sixth experiment example | $MgMn_2O_4$ | Spinel | DLC | $10^7$ | $10^3$ | $10^7$ |
| Seventh experiment example | $MgCo_2O_4$ | Spinel | DLC | $10^7$ | $10^3$ | $10^7$ |
| Eighth experiment example | $CoMn_2O_4$ | Spinel | DLC | $10^7$ | $10^3$ | $10^7$ |
| Ninth experiment example | $CaCr_2O_4$ | Marokite | DLC | $10^7$ | $10^3$ | $10^7$ |
| Tenth experiment example | $CaMn_2O_4$ | Marokite | DLC | $10^7$ | $10^3$ | $10^7$ |
| Eleventh experiment example | $SrMn_2O_4$ | Cryptomelen | DLC | $10^7$ | $10^3$ | $10^7$ |
| Twelfth experiment example | $Ba_{0.25}Mn_2O_4$ + Ba | Cryptomelen | DLC | $10^7$ | $10^3$ | $10^7$ |
| Thirteenth experiment example | $Zn_{0.25}Mn_2O_4$ + Zn | Ramsdelite | DLC | $10^8$ | $10^3$ | $10^7$ |
| Fourteenth experiment example | $CuAlO_2$ | Delafosite | DLC | $10^8$ | $10^3$ | $10^6$ |
| Fifteenth experiment example | $MgCrO_3$ | Ilmenite | DLC | $10^7$ | $10^3$ | $10^6$ |
| Sixteenth experiment example | $NiWN_2$ | $LiMoN_2$ | $SnO_2$ | $10^7$ | $10^3$ | $10^5$ |
| Seventeenth experiment example | $Zn_{1.2}V_{1.8}O_4$ | Spinel | $SnO_2$ | $10^6$ | $10^2$ | $10^6$ |
| Eighteenth experiment example | $Zn_{1.2}Cr_{1.8}O_4$ | Spinel | $SnO_2$ | $10^6$ | $10^2$ | $10^6$ |
| Ninteenth experiment example | $ZnAl_{1.8}Cr_{0.2}O_4$ | Spinel | $SnO_2$ | $10^8$ | $10^3$ | $10^8$ |
| Twentieth experiment example | $ZnAl_{1.8}Mn_{0.2}O_4$ | Spinel | $SnO_2$ | $10^8$ | $10^3$ | $10^8$ |
| Twenty first experiment example | $SiNi_2O_4$ | Olivine | $SnO_2$ | $10^8$ | $10^3$ | $10^5$ |
| Twenty second experiment example | $SeNi_2O_4$ | Olivine | $SnO_2$ | $10^8$ | $10^3$ | $10^5$ |

TABLE 1-continued

| | Material for recording layer | Crystalline structure | Protective layer | Initial Resistance value [Ω] | Resistance value after recording [Ω] | Resistance value after erasure [Ω] |
|---|---|---|---|---|---|---|
| Twenty third experiment example | $NiTiO_3$ | Ilmenite | $SnO_2$ | $10^8$ | $10^3$ | $10^5$ |
| Twenty fourth experiment example | $ZnMn_2O_4/TiO_2$ | $\lambda MnO_2$ ($TiO_2$) | DLC | $10^7$ | $10^3$ | $10^7$ |
| Twenty fifth experiment example | $ZnMn_2O_4/ZrO_2$ | $\lambda MnO_2$ ($ZrO_2$) | DLC | $10^7$ | $10^3$ | $10^7$ |
| Twenty sixth experiment example | $MgMn_2O_4/TiO_2$ | $\lambda MnO_2$ ($TiO_2$) | DLC | $10^7$ | $10^3$ | $10^7$ |
| Twenty seventh experiment example | $MgMn_2O_4/ZrO_2$ | $\lambda MnO_2$ ($ZrO_2$) | DLC | $10^7$ | $10^3$ | $10^7$ |
| Twenty eighth experiment example | $SrMoO_3/ReO_3$ | $ReO_3$ ($ReO_3$) | DLC | $10^7$ | $10^3$ | $10^7$ |
| Comparative example | $ZnMn_2O_4$ | Spinel (Heterolite) | DLC | $10^7$ | $10^3$ | $10^7$ |

6. Application to Flash Memory (1) Structure

Examples of the present invention can be applied to a flash memory.

Figure 16:
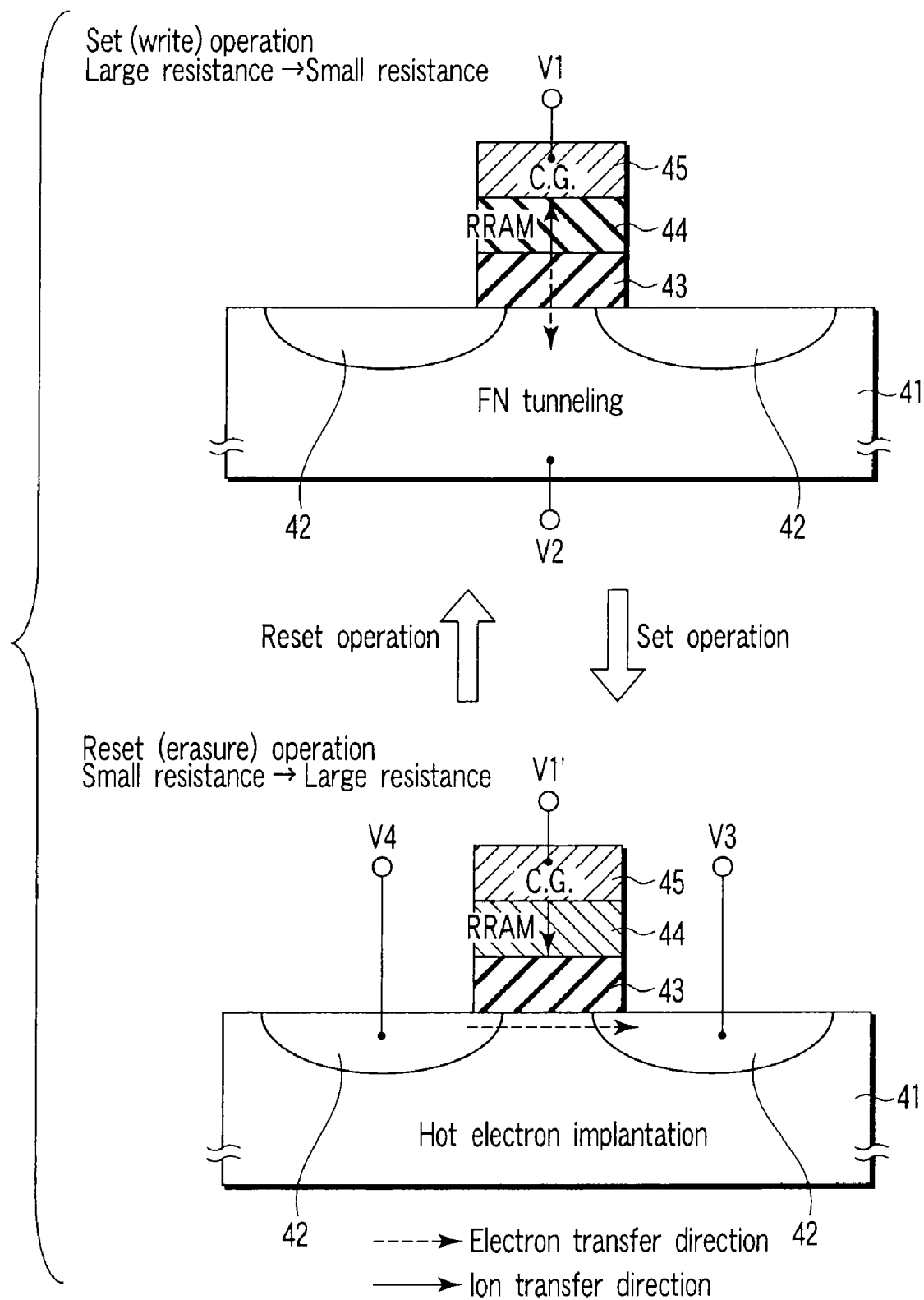
FIG. 16 is a diagram showing an example of application to a flash memory.

FIG. 16 shows memory cells of the flash memory.

Memory cells of the flash memory are composed of metal-insulator-semiconductor (MIS) transistors.

Diffusion layers 42 are formed in a surface region of a semiconductor substrate 41. A gate insulation layer 43 is formed on a channel region between the diffusion layers 42. A recording layer (RRAM: Resistive RAM) 44 according to an example of the present invention is formed on the gate insulation layer 43. A control gate electrode 45 is formed on the recording layer 44.

The semiconductor substrate 41 may be a well region, and the semiconductor substrate 41 and the diffusion layer 42 have electrically conductive types that are opposite to each other. The control gate electrode 45 is obtained as a word line, and is composed of, for example, an electrically conductive polysilicon.

The recording layer 44 is composed of a material shown in FIG. 1, FIG. 2, or FIG. 3.

(2) Basic Operation

A basic operation will be described with reference to FIG. 16.

A set (write) operation is executed by applying a potential V1 to the control gate electrode 45, and applying a potential V2 to the semiconductor substrate 41.

A difference between the potentials V1 and V2 needs to be sufficiently great such that the recording layer 44 makes a phase change or a resistance change, and however, its orientation is not limited in particular.

That is, either of V1>V2 and V1<V2 may be met.

For example, assuming that, in an initial state (reset state), the recording layer 44 is made of an insulator (large resistance), the gate insulation layer 43 is substantially thickened, so that the threshold value of the memory cells (MIS transistors) is increased.

When the potentials V1 and V2 are applied in this state to change the recording layer 44 to an electric conductor (small resistance), the gate insulation layer 43 is substantially thinned, so that the threshold value of the memory cells (MIS transistors) is lowered.

Although the potential V2 is applied to the semiconductor substrate 41, the potential V2 may be transferred from the diffusion layer 42 to the channel region of the memory cells instead thereof.

A reset (erasure) operation is executed by applying a potential V1' to the control gate electrode 45, applying a potential V3 to one diffusion layer 42, and applying a potential V4 (<V3) to the other diffusion layer 42.

The potential V1' is set at a value that exceeds the threshold value of the memory cells in the set state.

At this time, the memory cells are turned ON, electrons flow toward one diffusion layer 42 from the other diffusion layer 42 as well as hot electrons are generated. Since the hot electrons are implanted into the recording layer 44 via the gate insulation layer 43, a temperature of the recording layer 44 rises.

In this manner, the recording layer 44 changes from an electric conductor (small resistance) to an insulator (large resistance). Thus, the insulation layer 43 is substantially thickened, so that the threshold value of the memory cells (MIS transistors) increases.

In this way, since the threshold value of the memory cells can be changed in accordance with a principle analogous to that of the flash memory, an information recording/reproducing apparatus according to the example of the invention can be practically used.

(3) NAND-Type Flash Memory

Figure 17:
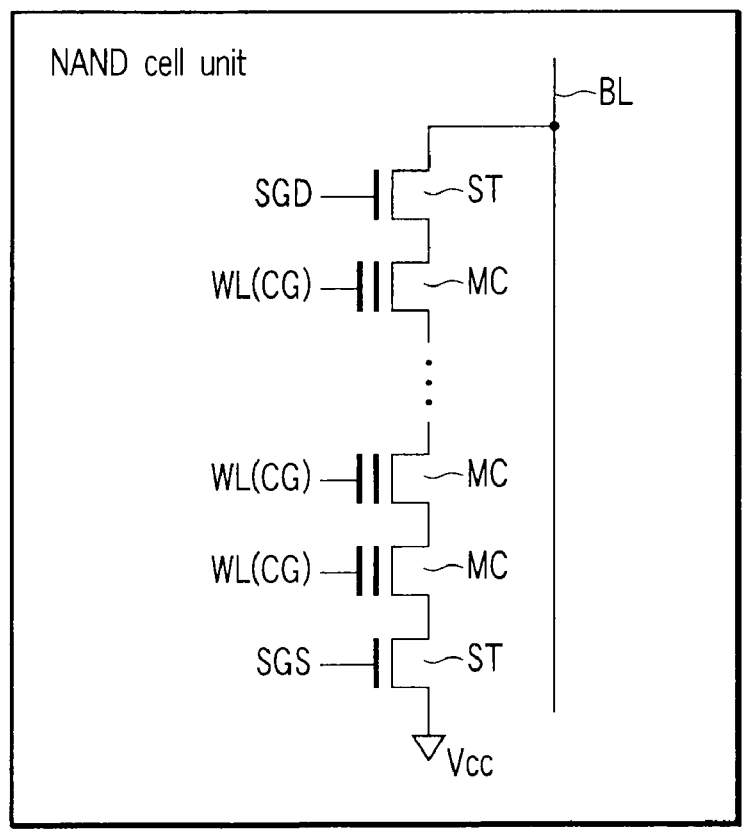
FIG. 17 is a circuit diagram depicting a NAND cell unit.
Figure 18:
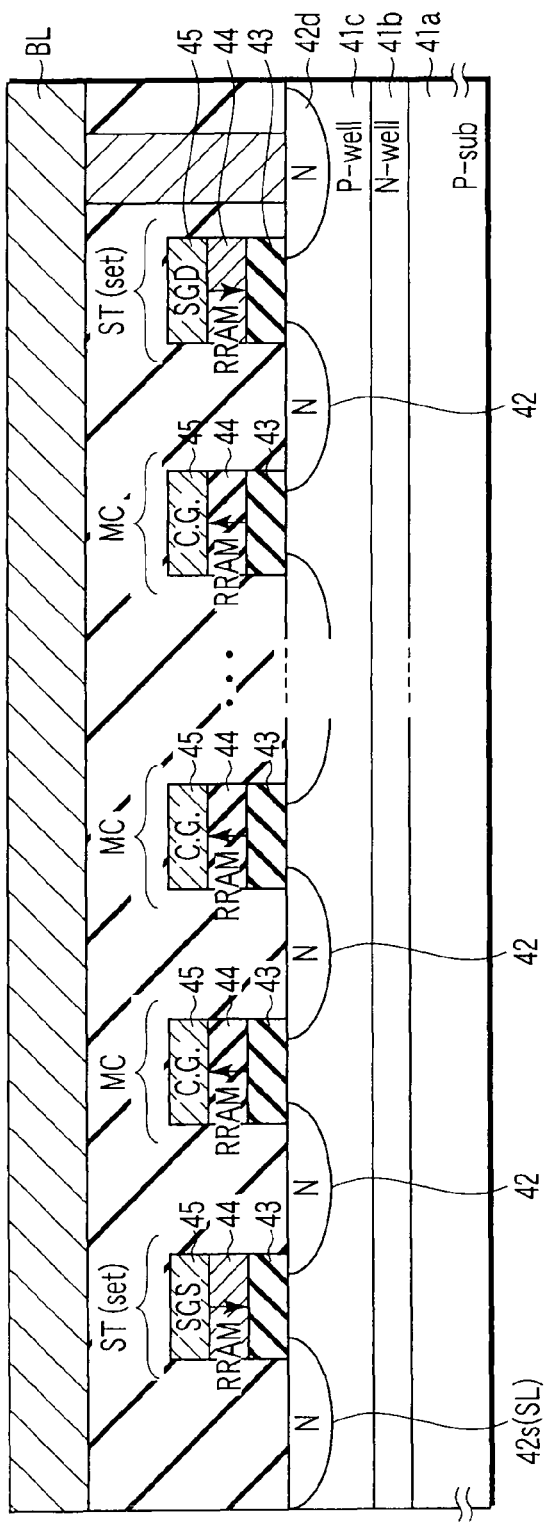
FIG. 18 is a view showing a structure of a NAND cell unit.

FIG. 17 shows a circuit diagram of a NAND cell unit. FIG. 18 shows a structure of a NAND cell unit according to an example of the invention.

An N-type well region 41b and a P-type well region 41c are formed in a P-type semiconductor substrate 41a. The NAND cell according to the example of the invention is formed in the P-type well region 41c.

The NAND cell unit is constituted by: a NAND string composed of a plurality of memory cells MCs connected in series; and a total of two select gate transistors ST, each of which is connected to both ends of the NAND string.

The memory cell MC and select transistor ST each have the same structure. Specifically, these elements each are configured of: N-type diffusion layers 42; a gate insulation layer 43 on a channel region between the N-type diffusion layers 42; a recording layer (PRAM) 44 on the gate insulation layer 43; and a control gate electrode 45 on the recording layer 44.

A state (insulator/electric conductor) of the recording layer 44 of the memory cell MC can be changed in accordance with the above-described basic operation. In contrast, the recording layer 44 of the select gate transistor ST is fixed at a set state, i.e., at an electric conductor (small resistance).

One of the select gate transistors STs is connected to a source line SL, and the other one is connected to a bit line BL.

All the memory cells in the NAND cell unit are assumed to be established in a reset state (large resistance) prior to a set (write) operation.

The set (write) operation is made sequentially in a stepwise manner from the memory cell MC at the side of the source line SL to the memory cell at the side of the bit line BL.

A write potential V1 (positive potential) is applied to a selected word line WL (control gate electrode), and a transfer potential Vpass (potential at which a memory cell MC is turned ON) is applied to an unselected word line WL.

The select gate transistor ST at the side of the source line SL is turned OFF, and the select gate transistor ST at the side of the bit line BL is turned ON, so that program data is transferred to the channel region of the selected memory cell MC from the bit line BL.

For example, when the program data is obtained as "1", a write disable potential (for example, potential substantially equal to V1) is transferred to the channel region of the selected memory cell MC, so that the resistance value of the recording layer 44 of the selected memory cell MC does not change from a high state to a low state.

In addition, when the program data is obtained as "0", V2 (<V1) is transferred to the channel region of the selected memory cell MC, and the resistance value of the recording layer 44 of the selected memory cell MC is changed from a high state to a low state. In the reset (erasure) operation, for example, V1' is applied to all the word lines WLs (control gate electrode), and all the memory cells MCs in the NAND cell unit are turned ON. In addition, two select gate transistors STs are turned ON, so that V3 is applied to the bit line BL and V4 (<V3) is applied to the source line SL.

At this time, hot electrons are implanted into the recording layers 44 of all the memory cells MCs in the NAND cell unit. Consequently, the reset operation is executed in batch with respect to all the memory cells MCs in the NAND cell unit.

Figure 19:
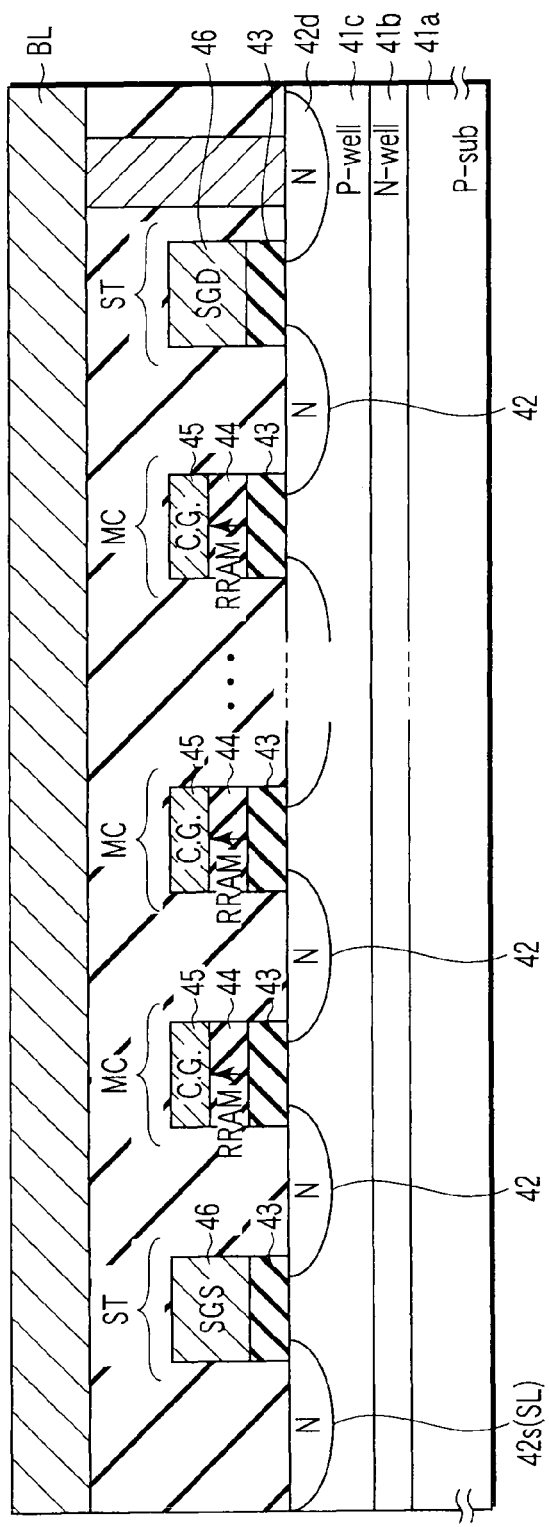
FIG. 19 is a view showing a structure of a NAND cell unit.

In a structure of FIG. 18, the select gate transistor ST has the same structure as the memory cell MC. However, for example, as shown in FIG. 19, the select gate transistor ST can be formed as a general MIS transistor without forming a recording layer.

Figure 20:
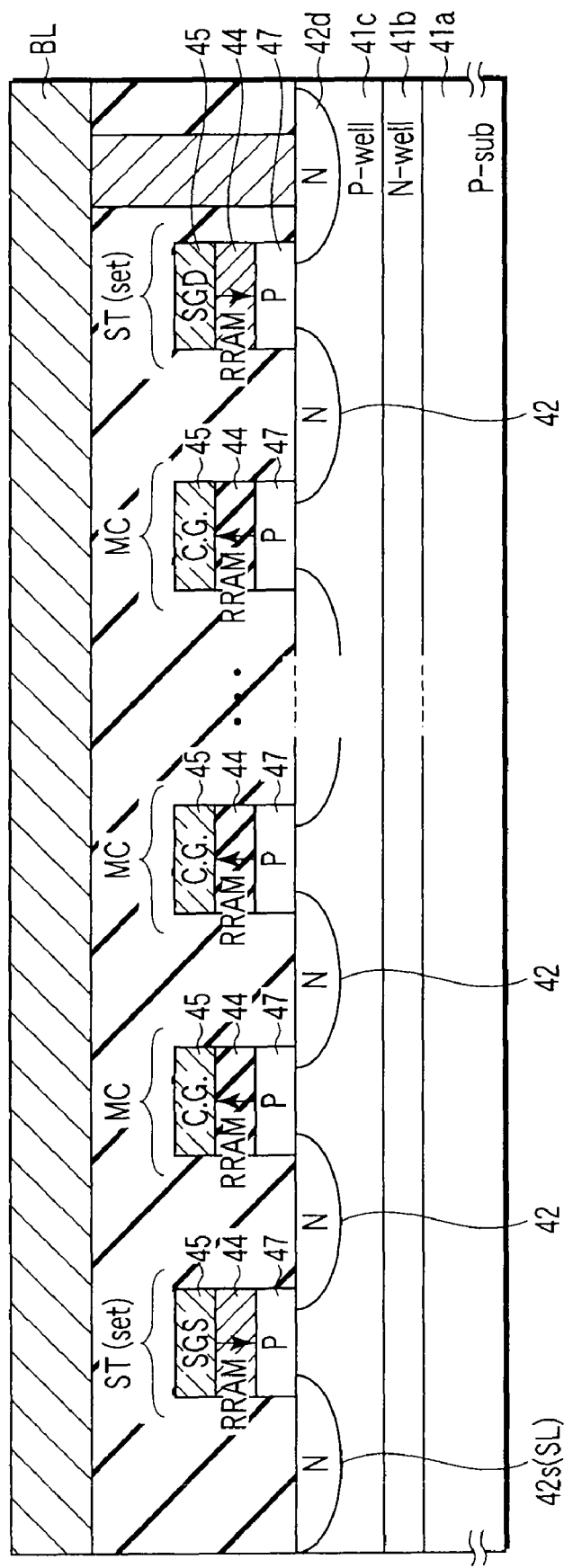
FIG. 20 is a view showing a structure of a NAND cell unit.

FIG. 20 shows a modified example of a NAND-type flash memory.

This modified example is featured in that gate insulation layers of a plurality of memory cells MC each configuring a NAND string are replaced with P-type semiconductor layers 47.

With advancement of high integration, if a memory cell MC is downsized, the P-type semiconductor layer 47 is filled with a depletion layer in a state in which no voltage is applied.

At the time of a set (write) operation, a positive write electric potential (for example, 3.5V) is applied to a control gate electrode 45 of the selected memory cell MC and a positive transfer electric potential (for example, 1V) is applied to a control gate electrode 45 of an unselected memory cell MC.

At this time, a surface of a P-type well region 41c of a plurality of memory cells MC in the NAND string is inverted from P-type to N-type, and a channel is formed.

Then, as described above, when a select gate transistor ST at the side of a bit line BL is turned ON, and program data "0" is transferred from the bit line BL to a channel region of the selected memory cell MC, the set operation can be carried out.

A reset (erase) operation can be carried out in batch with respect to all of the memory cells MC configuring the NAND string by applying a negative erasing electric potential (for example, −3.5V) to all of the control gate electrodes 45, for example, and then, applying a grounding electric potential (0V) to the P-type well region 41c and the p-type semiconductor layer 47.

At the time of the readout operation, a positive readout electric potential (for example 0.5V) is applied to the control gate electrode 45 of the selected memory cell MC and a transfer electric potential (for example, 1V) on which the memory cell MC is always turned ON regardless of data "0" or "1" is applied to the control gate electrode 45 of the unselected memory cell MC.

However, a threshold voltage Vth"1" of the memory cell MC in a "1" state is assumed to be within the range of 0V<Vth"1"<0.5V, and a threshold voltage Vth"0" of the memory cell MC in a "0" state is assumed to be within the range of 0.5 V<Vth"0"<1V.

In addition, two select gate transistors ST are turned ON, and then, a read current is supplied to the NANT string.

When such a situation is established, a current amount supplied to the NAND string changes according to a value of data stored in the selected memory cell MC. Thus, data can be read out by detecting this change.

In this modified example, it is desirable that a hole dope quantity of the P-type semiconductor layer 47 be greater than that of the P-type well region 41c and that a Fermi level of the P-type semiconductor layer 47 be deeper by about 0.5V than that of the P-type well region 41c.

This is because, when a positive electric potential is applied to the control gate electrode 45, inversion from P-type to N-type starts from a surface portion of the P-type well region 41c between N-type diffusion layers 42, and a channel is formed.

By doing this, for example, at the time of the write operation, a channel of an unselected memory cell MC is formed on only an interface between the P-type well region 41c and the P-type semiconductor layer 47. At the time of the readout operation, a channel of a plurality of memory cells MC in the NAND string is formed on only an interface between the P-type well region 41c and the P-type semiconductor layer 47.

Namely, even if a recording layer 44 of the memory cell MC is an electrically conductive element (in a set state), the diffusion layer 42 and the control gate electrode 45 are not short-circuited.

(4) NOR-Type Flash Memory

Figure 21:
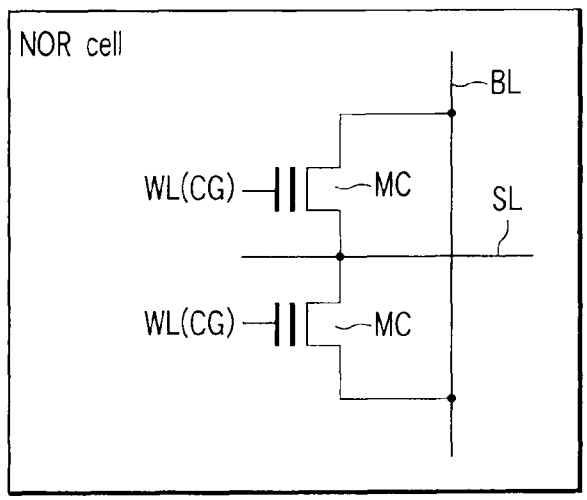
FIG. 21 is a circuit diagram depicting a NOR cell.
Figure 22:
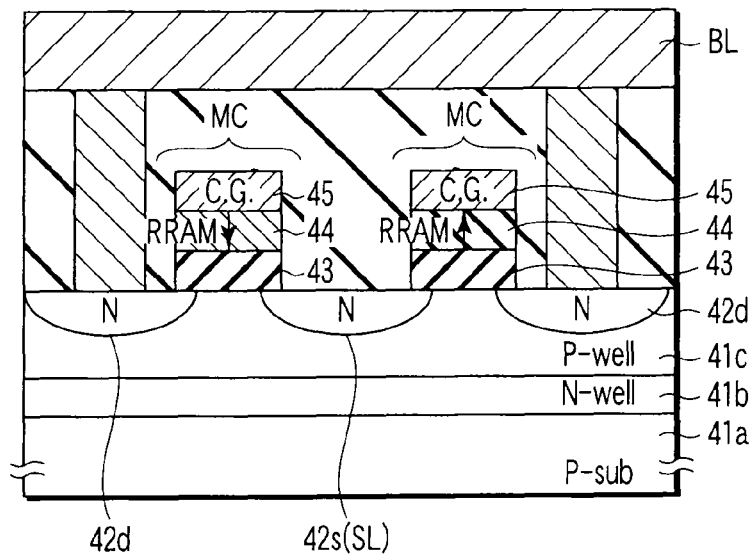
FIG. 22 is a view showing a structure of a NOR cell.

FIG. 21 shows a circuit diagram of a NOR cell unit. FIG. 22 shows a structure of a NOR cell unit according to an example of the present invention.

An N-type cell region 41b and a P-type well region 41c are formed in a P-type semiconductor substrate 41a. NOR cells according to the example of the invention are formed in the P-type well region 41c.

The NOR cells each are constituted by one memory cell (MIS transistor) MC connected between a bit line BL and a source line SL.

The memory cells MCs each are configured of: N-type diffusion layers 42; a gate insulation layer 43 on a channel between the N-type diffusion layers 42; a recording layer (PRAM) 44 on the gate insulation layer 43; and a control gate electrode 45 on the recording layer 44.

A state (insulator/electric conductor) of the recording layer 44 of the memory cell MCs can be changed in accordance with the above-described basic operation.

(5) 2tr Cell-Type Flash Memory

Figure 23:
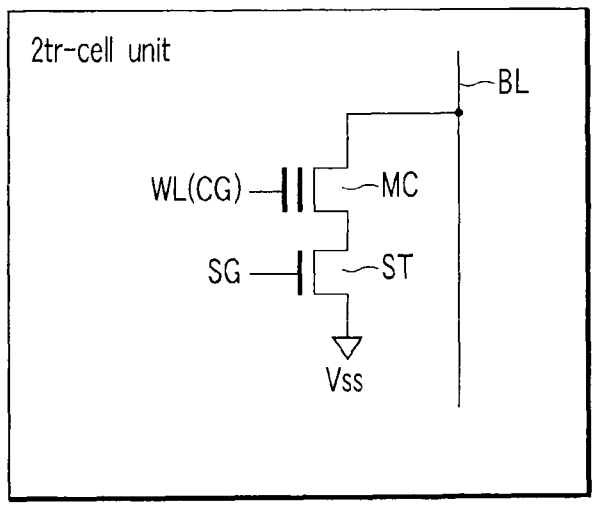
FIG. 23 is a circuit diagram depicting a 2tr cell unit.
Figure 24:
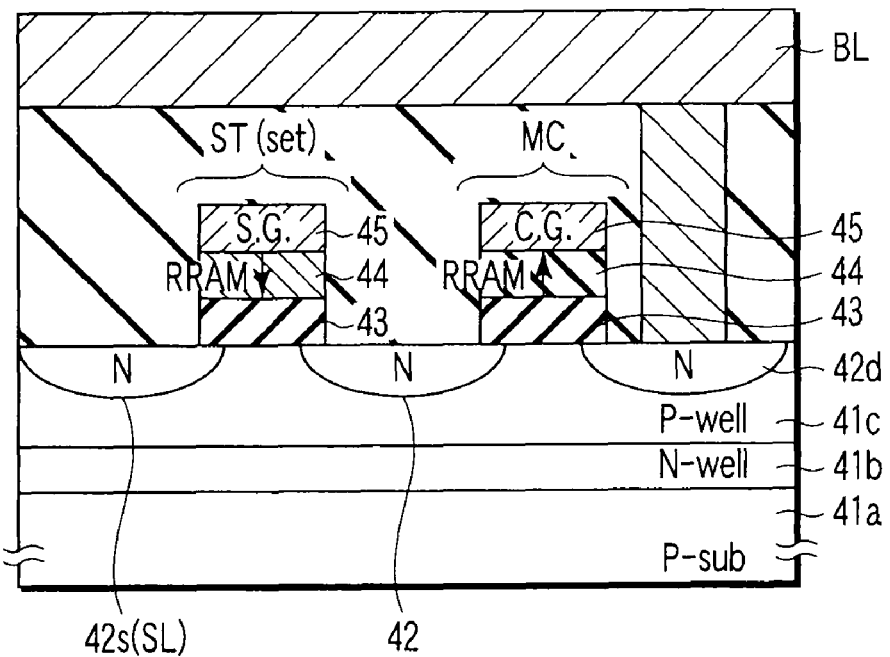
FIG. 24 is a view showing a structure of a 2tr cell unit.

FIG. 23 shows a circuit diagram of a 2tr cell unit. FIG. 24 shows a structure of a 2tr cell unit according to an example of the present invention.

The 2tr cell unit has been recently developed as a new cell structure having features of the NAND cell unit and the features of the NOR cell unit.

An N-type well region 41b and a P-type well region 41c are formed in a P-type semiconductor substrate 41a. The 2tr cell unit according to the example of the invention is formed in the P-type well region 41c.

The 2tr cell unit is composed of one memory cell MC and one selector gate transistor ST connected in series.

The memory cell MC and the select gate transistor ST each have the same structure. Specifically, these elements each are configured: N-type diffusion layers 42; a gate insulation layer 43 on a channel region between the N-type diffusion layers 42; a recording layer (PRAM) 44 on the gate insulation layer 43; and a control gate electrode 45 on the recording layer 44.

A state (insulator/electric conductor) of the recording layer 44 of the memory cell MC can be changed in accordance with the above-described basic operation. In contrast, the recording layer 44 of the select gate transistor ST is fixed at a set state, i.e., at an electric conductor (small resistance).

The select gate transistor ST is connected to a source line SL, and the memory cell MC is connected to a bit line BL.

A state (insulator/electric conductor) of the recording layer 44 of the memory cell MC can be changed in accordance with the above-described basic operation.

Figure 25:
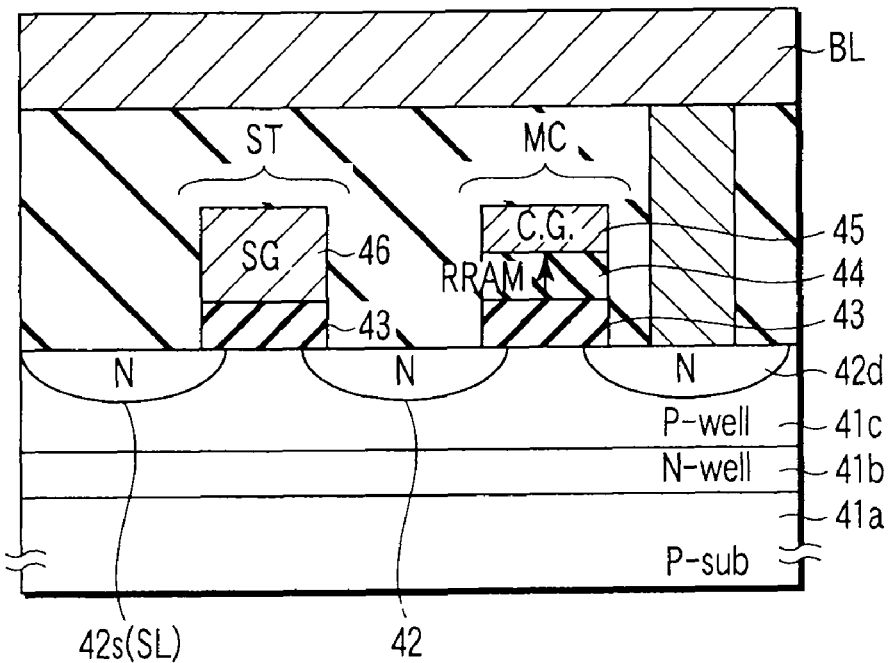
FIG. 25 is a view showing a structure of a 2tr cell unit.

In the structure of FIG. 24, the select gate transistor ST has the same structure as the memory cell MC. However, for example, as shown in FIG. 25, the select gate transistor ST can be formed as a general MIS transistor without forming a recording layer.

7. Others

According to the examples of the invention, a recording (write) operation is carried out only at a site (recording unit) at which an electric field has been applied. As a consequence, data can be recorded in a very small region with very small amount of power consumption.

In addition, an erasure operation is achieved by applying a heat. However, a structural change hardly occurs when using the materials proposed in the examples of the present invention, thus enabling the erasure operation with very small amount of power consumption.

Further, according to the examples of the invention, an initial state (insulator is established in the most stable energy state. After a write operation, an electric conductor portion is formed in the insulator. For this reason, at the time of a read operation, a current flows intensively in the electric conductor portion, making it possible to achieve a principle of recording with very high sensing efficiency.

As has been described above, according to the examples of the invention, data recording can be carried out at a recording density that cannot be achieved in a prior art, in spite of a very simple mechanism. Accordingly, the examples of the invention have a great industrial advantage as a next-generation technique that breaks the achievement of the recording density of a currently available nonvolatile memory.

Additional advantages and modification will readily occur to those skilled in the art. Therefore, the invention in its broader aspects is not limited to the specific details and representative embodiments shown and described herein. Accordingly, various modification may be made without departing from the spirit or scope of the general inventive concept as defined by the appended claims and their equivalents.

The invention claimed is:

1. A data read/write device comprising:
a recording layer; and
means for applying a voltage to the recording layer, generating a resistance change in the recording layer, and recording data, wherein the recording layer is composed of:
 i. a first compound represented by $A_xM_yX_z$ (where A and M are cation elements, X is at least one element selected from O, S, Se, N, Cl, Br, and I, and molar ratios x, y and z satisfy $0.5 \leq x \leq 1.5$, $0.5 \leq y \leq 2.5$, and $1.5 \leq z \leq 4.5$, respectively); and
 ii. a second compound having at least one transition element and having a cavity site capable of housing the cation element of the first compound.

2. The data read/write device according to claim 1, wherein the means includes a head which locally applies the voltage to the recording layer.

3. The data read/write device according to claim 1, wherein the means includes a word line and a bit line which sandwich the recording layer therebetween.

4. The data read/write device according to claim 1, wherein the means includes an MIS transistor, and the recording layer is arranged between a gate electrode and a gate insulation layer of the MIS transistor.

5. The data read/write device according to claim 1, wherein the means includes
a semiconductor substrate of a first conductivity type,
two diffusion layers of a second conductivity type provided in the semiconductor substrate,
a semiconductor layer on the semiconductor substrate which is provided in an area between the two diffusion layers, and
a gate electrode which controls a connecting or a disconnecting between the two diffusion layers, wherein the recording layer is provided between the gate electrode and the semiconductor layer.

6. The data read/write device according to claim 3, further comprising:
a diode which is added to the recording layer.

7. The data read/write device according to claim 3, further comprising:
a heater layer which is added to the recording layer and heats the recording layer.

8. The data read/write device according to claim 1, further comprising:
an electrode layer arranged on one face of the recording layer; and
a protective later arranged on the other face of the recording layer.

9. The data read/write device according to claim 8, wherein the protective layer has a function of preventing the recording layer from reacting with an atmospheric air.

10. The data read/write device according to claim 1, wherein the second compound is composed of:
□x$MZ_2$ where □ is the cation element housed in the cavity site;
M is at least one element selected from Ti, Ge, Sn, V, Cr, Mn, Fe, Co, Ni, Nb, Ta, Mo, W, Re, Ru, and Rh;

X is at least one element selected from O, S, Se, N, Cl, Br, and I; and $0.3 \leqq x \leqq 1$ is established.

11. The data read/write device according to claim 1, wherein the second compound is composed of:
□xMX₃ where □ is the cation element housed in the cavity site;
M is at least one element selected from Ti, Ge, Sn, V, Cr, Mn, Fe, Co, Ni, Nb, Ta, Mo, W, Re, Ru, and Rh;
X is at least one element selected from O, S, Se, N, Cl, Br, and I; and
$1 \leqq x \leqq 2$ is established.

12. The data read/write device according to claim 1, wherein the second compound is composed of:
□xMX₄ where □ is the cation element housed in the cavity site;
M is at least one element selected from Ti, Ge, Sn, V, Cr, Mn, Fe, Co, Ni, Nb, Ta, Me, W, Re, Ru, and Rh;
X is at least one element selected from O, S, Se, N, Cl, Br, and I; and
$1 \leqq x \leqq 2$ is established.

13. The data read/write device according to claim 1, wherein the second compound is composed of:
□xMPOz where □ is the cation element housed in the cavity site;
M is at least one element selected from Ti, Ge, Sn, V, Cr, Mn, Fe, Co, Ni, Nb, Ta, Me, W, Re, Ru, and Rh;
P is a phosphorous element;
O is an oxygen element; and
$0.3 \leqq x \leqq 3$, and $4 \leqq z \leqq 6$ are established.

14. The data read/write device according to claim 1, wherein the second compound has one of a Hollandite structure, a Ramsdelite structure, an Anatase structure, a Brookite structure, a Pyrolusite structure, a ReO₃ structure, a MoO₁.₅PO₄ structure, a TiO₀.₅OP₄ structure, a FePO₄ structure, a βMnO₂ structure, a γMnO₂ structure, and a λMnO₂ structure.

15. The data read/write device according to claim 1, wherein a Fermi level of electrons of the first compound is lower than a Fermi level of electrons the second compound.

16. The data read/write device according to claim 8, wherein the electrode layer is composed of:
MN where M is at least one element selected from the group consisting of Ti, Zr, Hf, V, Nb, and Ta; and
N is nitrogen.

17. The data read/write device according to claim 8, wherein the electrode layer is composed of:
MO$_x$ where M is at least one element selected from the group consisting of Ti, V, Cr, Mn, Fe, Co, Ni, Cu, Zr, Nb, Me, Ru, Rh, Pd, Ag, Hf, Ta, W, Re, Ir, Os, and Pt; and
a molar ratio x satisfies $1 \leqq x \leqq 4$.

18. The data read/write device according to claim 8, wherein the electrode layer is composed of:
AMO₃ where A is at least one element selected from the group consisting of La, K, Ca, Sr, Ba, and Ln (Lanthanide);
M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and
Pt; and O is oxygen.

19. The data read/write device according to claim 8, wherein the electrode layer is composed of:
A₂MO₄ where A is at least one element selected from the group consisting of K, Ca, Sr, Ba, and Ln (Lanthanide);
M is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os, and
Pt; and O is oxygen.

20. The data read/write device according to claim 8, wherein the protective layer is composed of a material selected from the group consisting of an amorphous carbon, a diamond-like carbon, and a semiconductor.

* * * * *